(12) United States Patent
Lee et al.

(10) Patent No.: US 11,094,626 B2
(45) Date of Patent: Aug. 17, 2021

(54) METHODS OF FORMING INTERCONNECT STRUCTURES IN SEMICONDUCTOR FABRICATION

(71) Applicant: Taiwan Semiconductor Manufacturing Co., Ltd., Hsin-Chu (TW)

(72) Inventors: Ming-Han Lee, Taipei (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/534,411

(22) Filed: Aug. 7, 2019

(65) Prior Publication Data
US 2020/0098685 A1    Mar. 26, 2020

Related U.S. Application Data

(60) Provisional application No. 62/735,520, filed on Sep. 24, 2018.

(51) Int. Cl.
| | |
|---|---|
| *H01L 23/522* | (2006.01) |
| *H01L 21/3213* | (2006.01) |
| *H01L 21/311* | (2006.01) |
| *H01L 21/321* | (2006.01) |
| *H01L 21/027* | (2006.01) |
| *H01L 21/768* | (2006.01) |
| *H01L 23/532* | (2006.01) |
| *H01L 23/528* | (2006.01) |

(52) U.S. Cl.
CPC ...... *H01L 23/5226* (2013.01); *H01L 21/0274* (2013.01); *H01L 21/31144* (2013.01); *H01L 21/3212* (2013.01); *H01L 21/32135* (2013.01); *H01L 21/32139* (2013.01); *H01L 21/7684* (2013.01); *H01L 21/76802* (2013.01); *H01L 21/76843* (2013.01); *H01L 21/76852* (2013.01); *H01L 21/76877* (2013.01); *H01L 21/76892* (2013.01); *H01L 23/5283* (2013.01); *H01L 23/53209* (2013.01); *H01L 23/53252* (2013.01)

(58) Field of Classification Search
CPC .................................................. H01L 23/5226
See application file for complete search history.

(56) References Cited

U.S. PATENT DOCUMENTS

| | | | |
|---|---|---|---|
| 2013/0015581 A1* | 1/2013 | Wann | H01L 21/76877 257/751 |
| 2015/0194382 A1* | 7/2015 | Lai | H01L 21/76885 257/737 |
| 2016/0126324 A1* | 5/2016 | Yu | H01L 29/402 257/503 |
| 2016/0218035 A1* | 7/2016 | Yang | H01L 21/76816 |
| 2016/0233865 A1* | 8/2016 | Tamura | H01L 23/528 |
| 2018/0374747 A1* | 12/2018 | Joi | C25D 3/58 |

(Continued)

*Primary Examiner* — Moazzam Hossain
(74) *Attorney, Agent, or Firm* — Haynes and Boone, LLP

(57) ABSTRACT

A method of fabricating a semiconductor interconnect structure includes forming a via in a dielectric layer, depositing a ruthenium-containing conductive layer over a top surface of the via and a top surface of the dielectric layer, and patterning the ruthenium-containing conductive layer to form a conductive line over the top surface of the via, where a thickness of the conductive line is less than a thickness of the via.

20 Claims, 14 Drawing Sheets

(56) References Cited

U.S. PATENT DOCUMENTS

| | | | |
|---|---|---|---|
| 2019/0164747 A1* | 5/2019 | Chang | H01L 21/76802 |
| 2019/0295856 A1* | 9/2019 | Tahara | H01J 37/32642 |
| 2019/0378836 A1* | 12/2019 | Wang | H01L 21/76877 |
| 2020/0006131 A1* | 1/2020 | Shimabukuro | H01L 21/76849 |

* cited by examiner

METHODS OF FORMING INTERCONNECT STRUCTURES IN SEMICONDUCTOR FABRICATION

CROSS-REFERENCE TO RELATED APPLICATIONS

This application claims priority to U.S. Provisional Patent Application Ser. No. 62/735,520 filed on Sep. 24, 2018, the entire disclosure of which is incorporated herein by reference.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that may be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, copper-based interconnect structures typically implemented in multilayer interconnect (MLI) features have presented performance, yield, and cost challenges as MLI features become more compact with ever-shrinking IC feature size. For example, interconnect structures thus formed have been observed to exhibit higher aspect ratios, resistivity, and line-to-line capacitance; cause damages in surrounding ILD layer(s); and develop voids, collapse, and/or bend during patterning and deposition processes. Accordingly, although existing interconnect structures have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
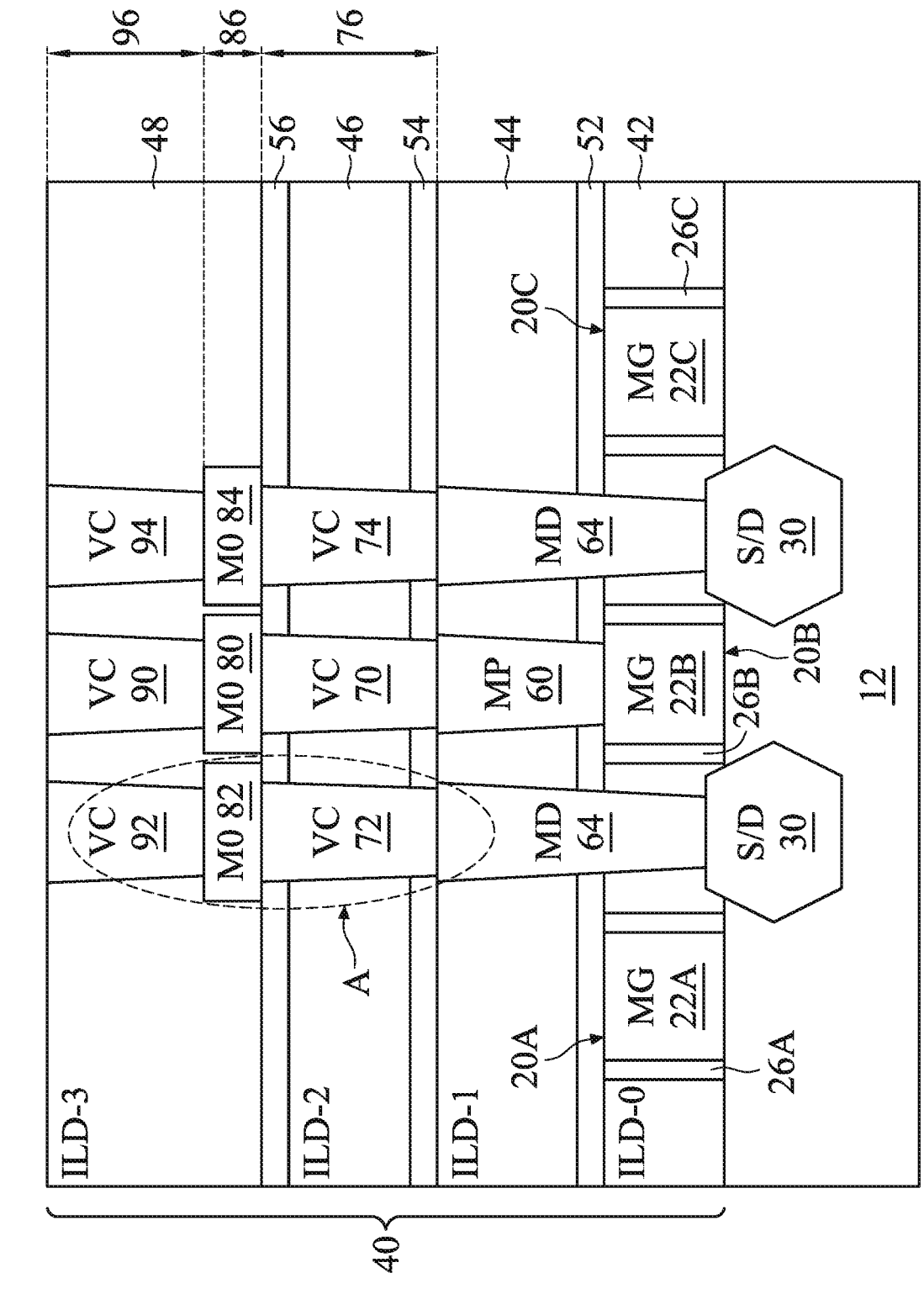
FIG. 1 is a fragmentary diagrammatic view of an integrated circuit device, in portion or entirety, according to various aspects of the present disclosure.

The present disclosure relates generally to integrated circuit devices, and more particularly, to interconnect structures for integrated circuit devices.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes may include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating interconnect structures that interconnect IC features fabricated by FEOL processes (referred to herein as FEOL features or structures) and MEOL processes (referred to herein as MEOL features or structures), thereby enabling operation of the IC devices. For example, BEOL processes may include forming multilayer interconnect features that facilitate operation of the IC devices. The present disclosure explores methods of forming interconnect structures during BEOL processes for improved IC device performance.

FIG. 1 is a fragmentary diagrammatic view of an integrated circuit device 10, in portion or entirety, according to various aspects of the present disclosure. Integrated circuit device 10 may be included in a microprocessor, a memory, and/or other integrated circuit device. In some implementations, integrated circuit device 10 is a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 1 has been simplified for the sake of clarity to better understand the inventive concepts of the present disclosure. Additional features may be added in integrated circuit device 10, and some of the features described below may be replaced, modified, or eliminated in other embodiments of integrated circuit device 10.

Integrated circuit device 10 includes a substrate (e.g., a wafer) 12. In the depicted embodiment, substrate 12 includes silicon. Alternatively or additionally, substrate 12 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. Alternatively, substrate 12 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods. Substrate 12 may include various doped regions (not shown) depending on design requirements of integrated circuit device 10. In some implementations, substrate 12 includes p-type doped regions (for example, p-type wells) doped with p-type dopants, such as boron (for example, BF2), indium, other p-type dopant, or combinations thereof. In some implementations, substrate 12 includes n-type doped regions (for example, n-type wells) doped with n-type dopants, such as phosphorus, arsenic, other n-type dopant, or combinations thereof. In some implementations, substrate 12 includes doped regions formed with a combination of p-type dopants and n-type dopants. The various doped regions may be formed directly on and/or in substrate 12, for example, providing a p-well structure, an n-well structure, a dual-well structure, a raised structure, or combinations thereof. An ion implantation process, a diffusion process, other suitable doping process, or combinations thereof may be performed to form the various doped regions. In some examples, substrate 12 may be a three-dimensional fin structure (i.e., substrate 12 may be alternatively referred to as fin structure 12 and FIG. 1 illustrates a cross-sectional view of the fin structure 12 along a fin length) including one or more semiconductor materials provided herein, and may further include doped regions as discussed above.

An isolation feature(s) (not shown) is formed over and/or in substrate 12 to isolate various regions, such as various device regions, of integrated circuit device 10. For example, isolation features define and electrically isolate active device regions and/or passive device regions from each other. Isolation features include silicon oxide, silicon nitride, silicon oxynitride, other suitable isolation material, or combinations thereof. Isolation features may include different structures, such as shallow trench isolation (STI) structures, deep trench isolation (DTI) structures, and/or local oxidation of silicon (LOCOS) structures. In some implementations, isolation features include STI features. For example, STI features may be formed by etching a trench in substrate 12 (for example, by using a dry etch process and/or wet etch process) and filling the trench with insulator material (for example, by using a chemical vapor deposition process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

Various gate structures are disposed over substrate 12, such as a gate structure 20A, a gate structure 20B, and a gate structure 20C. In some implementations, one or more of gate structures 20A-20C interpose a source region and a drain region, where a channel region is defined between the source region and the drain region. The one or more gate structures 20A-20C engage the channel region, such that current may flow between the source/drain regions during operation. In some implementations, gate structures 20A-20C are formed over a fin structure (e.g., fin structure 12), such that gate structures 20A-20C each wrap a portion of the fin structure. For example, one or more of gate structures 20A-20C wrap channel regions of the fin structure, thereby interposing a source region and a drain region of the fin structure.

Gate structures 20A-20C include metal gate (MG) stacks, such as a metal gate stack 22A, a metal gate stack 22B, and a metal gate stack 22C. Metal gate stacks 22A-22C are configured to achieve desired functionality according to design requirements of integrated circuit device 10, such that metal gate stacks 22A-22C include the same or different layers and/or materials. In some implementations, metal gate stacks 22A-22C include a gate dielectric (for example, a gate dielectric layer; not shown) and a gate electrode (for example, a work function layer and a conductive bulk layer; not shown). Metal gate stacks 22A-22C may include numerous other layers, for example, capping layers, interface layers, diffusion layers, barrier layers, hard mask layers, or combinations thereof. In some implementations, the gate dielectric layer is disposed over an interfacial layer (including a dielectric material, such as silicon oxide), and the gate electrode is disposed over the gate dielectric layer. The gate dielectric layer includes a dielectric material, such as silicon oxide, high-k dielectric material, other suitable dielectric material, or combinations thereof. Examples of high-k dielectric material include hafnium dioxide ($HfO_2$), HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. In some implementations, the gate dielectric layer is a high-k dielectric layer. The gate electrode includes a conductive material, such as polysilicon, aluminum (Al), copper (Cu), titanium (Ti), tantalum (Ta), tungsten (W), molybdenum (Mo), cobalt (Co), TaN, NiSi, CoSi, TiN, WN, TiAl, TiAlN, TaCN, TaC, TaSiN, other conductive material, or combinations thereof. In some implementations, the work function layer is a conductive layer tuned to have a desired work function (such as an n-type work function or a p-type work function), and the conductive bulk layer is a conductive layer formed over the work function layer. In some implementations, the work function layer includes n-type work function materials, such as Ti, silver (Ag), manganese (Mn), zirconium (Zr), TaAl, TaAlC, TiAlN, TaC, TaCN, TaSiN, other suitable n-type work function materials, or combinations thereof. In some implementations, the work function layer includes a p-type work function material, such as Mo, Al, ruthenium (Ru), TiN, TaN, WN, $ZrSi2$, $MoSi2$, $TaSi2$, $NiSi2$, WN, other suitable p-type work function materials, or combinations thereof. The bulk (or fill) conductive layer includes a suitable conductive material, such as Al, W, and/or Cu. The conductive bulk layer may additionally or collectively include polysilicon, Ti, Ta, metal alloys, other suitable materials, or combinations thereof.

Gate structures 20A-20C are formed by deposition processes, lithography processes, etching processes, other suitable processes, or combinations thereof. The deposition processes include CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LPCVD), atmospheric pressure CVD (APCVD), electroplating, other suitable methods, or combinations thereof. The lithography patterning processes include resist coating (for example, spin-on coating), soft baking, mask aligning, exposure, post-exposure baking, developing the resist, rinsing, drying (for example, hard baking), other suitable processes, or combinations thereof. Alternatively, the lithography exposure process is assisted, implemented, or replaced by other methods, such as maskless lithography, electron-beam writing, or ion-beam writing. The etching processes include dry etching processes, wet etching processes, other etching processes, or combinations thereof. Metal gate stacks 22A-22C are fabricated according to a gate-last process, a gate-first process, or a hybrid gate-last/gate-first process. In gate-last process implementations, gate structures 20A-20D include dummy gate stacks that are subsequently replaced with metal gate stacks 22A-22C. The dummy gate stacks include, for example, an interfacial layer (including, for example, silicon oxide) and a dummy gate electrode layer (including, for example, polysilicon). In such implementations, the dummy gate electrode layer is removed, thereby forming openings (trenches) in which metal gate stacks 22A-22C are formed.

Gate structures 20A-20C further include spacers 26A-26C, which are disposed adjacent to (for example, along sidewalls of) metal gate stacks 22A-22C, respectively. Spacers 26A-26C are formed by any suitable process and include a dielectric material. The dielectric material may include silicon, oxygen, carbon, nitrogen, other suitable material, or combinations thereof (for example, silicon oxide, silicon nitride, silicon oxynitride, or silicon carbide). For example, in the depicted embodiment, a dielectric layer containing silicon and nitrogen, such as a silicon nitride layer, may be deposited over substrate 12 and subsequently anisotropically etched to form spacers 26A-26C. In some implementations, spacers 26A-26C include a multi-layer structure, such as a first dielectric layer that includes silicon nitride and a second dielectric layer that includes silicon oxide. In some implementations, more than one set of spacers, such as seal spacers, offset spacers, sacrificial spacers, dummy spacers, and/or main spacers, are formed adjacent to metal gate stacks 22A-22C. In such implementations, the various sets of spacers may include materials having different etch rates. For example, a first dielectric layer containing silicon and oxygen (for example, silicon oxide) may be deposited over substrate 12 and subsequently anisotropically etched to form a first spacer set adjacent to metal gate stacks 22A-22C (or dummy metal gate stacks, in some implementations), and a second dielectric layer including silicon and nitrogen (for example, silicon nitride) may be deposited over substrate 12 and subsequently anisotropically etched to form a second spacer set adjacent to the first spacer set. Implantation, diffusion, and/or annealing processes may be performed to form lightly doped source and drain (LDD) features and/or heavily doped source and drain (HDD) features in substrate 12 before and/or after forming spacers 26A-26C, depending on design requirements of integrated circuit device 10.

Epitaxial source features and epitaxial drain features (referred to as epitaxial source/drain features) are disposed in source/drain regions of substrate 12. For example, a semiconductor material is epitaxially grown on substrate 12, forming epitaxial source/drain features 30 over a source region and a drain region of substrate 12. In the depicted embodiment, gate structure 20B interposes epitaxial source/drain features 30, and a channel region is defined between epitaxial source/drain features 30. Gate structure 20B and epitaxial source/drain features 30 thus form a portion of a transistor, such a pull-up transistor or a pull-down transistor, of integrated circuit device 10. Gate structure 20B and/or epitaxial source/drain features 30 are thus alternatively referred to as device features. In some implementations, epitaxial source/drain features 30 wrap source/drain regions of a fin structure. An epitaxy process may implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process may use gaseous and/or liquid precursors, which interact with the composition of substrate 12. Epitaxial source/drain features 30 are doped with n-type dopants and/or p-type dopants. In some implementations, where integrated circuit device 10 is configured as an n-type device (for example, having an n-channel), epitaxial source/drain features 30 are epitaxial layers containing silicon and/or carbon, where silicon-containing epitaxial layers or silicon-carbon-containing epitaxial layers are doped with phosphorous, other n-type dopant, or combinations thereof (for example, forming a Si:P epitaxial layer or a Si:C:P epitaxial layer). In some implementations, where integrated circuit device 10 is configured as a p-type device (for example, having a p-channel), epitaxial source/drain features 30 are epitaxial layers containing silicon and germanium, where the silicon germanium containing epitaxial layers are doped with boron, other p-type dopant, or combinations thereof (for example, forming a Si:Ge:B epitaxial layer). In some implementations, epitaxial source/drain features 30 include materials and/or dopants that achieve desired tensile stress and/or compressive stress in the channel region. In some implementations, epitaxial source/drain features 30 are doped during deposition by adding impurities to a source material of the epitaxy process. In some implementations, epitaxial source/drain features 30 are doped by an ion implantation process subsequent to a deposition process. In some implementations, annealing processes are performed to activate dopants in epitaxial source/drain features 30 and/or other source/drain regions of integrated circuit device 10 (for example, HDD regions and/or LDD regions).

A multilayer interconnect (MLI) feature 40 is disposed over substrate 12. MLI feature 40 electrically couples various devices (for example, transistors, resistors, capacitors, and/or inductors) and/or components (for example, gate structures and/or source/drain features) of integrated circuit device 10, such that the various devices and/or components may operate as specified by design requirements of integrated circuit device 10. MLI feature 40 includes a combination of dielectric layers and conductive layers configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 40. During operation of integrated circuit device 10, the interconnect structures are configured to route signals between the devices and/or the components of integrated circuit device 10 and/or distribute signals (for example, clock signals, voltage signals, and/or ground signals) to the devices and/or the components of integrated circuit device 10. It is noted that though MLI feature 40 is depicted with a given number of dielectric layers and conductive layers, the present disclosure contemplates MLI feature 40 having more or less dielectric layers and/or conductive layers depending on design requirements of integrated circuit device 10.

In FIG. 1, MLI feature 40 includes one or more dielectric layers, such as an interlayer dielectric layer 42 (ILD-0) disposed over substrate 12, an interlayer dielectric layer 44 (ILD-1) disposed over ILD layer 42, an interlayer dielectric layer 46 (ILD-2) disposed over ILD layer 44, and an interlayer dielectric layer 48 (ILD-3) disposed over ILD layer 46. In some embodiments, ILD layers 44, 46, and 48 are alternatively referred to as inter-metal dielectric (IMD) layers. ILD layers 42-48 include a dielectric material including, for example, silicon oxide, silicon nitride, silicon oxynitride, tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), low-k dielectric material, other suitable dielectric material, or combinations thereof. Exemplary low-k dielectric materials include FSG, carbon doped silicon oxide, Black Diamond® (Applied Materials of Santa Clara, Calif.), Xerogel, Aerogel, amorphous fluorinated carbon, Parylene, BCB, SILK (Dow Chemical, Midland, Mich.), polyimide, other low-k dielectric material, or combinations thereof. In the depicted embodiment, ILD layers 42-48 are dielectric layers that include a low-k dielectric material (generally referred to as low-k dielectric layers). ILD layers 42-48 may include a multilayer structure having multiple dielectric materials. MLI feature 40 may further include one or more etch stop layers (ESL) disposed over substrate 12, such as an ESL 52 disposed between ILD layer 42 and ILD layer 44, an ESL 54 disposed between ILD layer 44 and ILD layer 46, and an ESL 56 disposed between ILD layer 46 and ILD layer 48. In some implementations, an ESL (not shown) is also disposed between substrate 12 and ILD layer 42. ESLs 52-56 contain a material different than ILD layers 42-48, such as a dielectric material that is different than the dielectric material of ILD layers 42-48. In the depicted embodiment, where ILD layers 42-48 include a low-k dielectric material, ESLs 52-56 include silicon and nitrogen (for example, silicon nitride or silicon oxynitride). ILD layers 42-48 and/or ESLs 52-56 are formed over substrate 12, for example, by a deposition process, such as CVD, PVD, ALD, PECVD, HDPCVD, MOCVD, RPCVD, LPCVD, ALCVD, APCVD, spin-on dielectric, plating, other suitable methods, or combinations thereof. In some implementations, ILD layers 42-48 and/or ESLs 52-56 are formed by a flowable CVD (FCVD) process that includes, for example, depositing a flowable material (such as a liquid compound) over substrate 12 and converting the flowable material to a solid material by a suitable technique, such as thermal annealing and/or ultraviolet radiation treating. Subsequent to the deposition of ILD layers 42-48 and/or ESLs 52-56, a CMP process and/or other planarization process is performed, such that ILD layers 42-48 and/or ESLs 52-56 have substantially planar surfaces.

A device-level contact 60, a device-level contact 62, a device-level contact 64, a via 70, a via 72, a via 74, a conductive line 80, a conductive line 82, a conductive line 84, a via 90, a via 92, and a via 94 are disposed in ILD layers 42-48 to form interconnect structures. Device-level contacts 60-64 (also referred to as local interconnects or local contacts) electrically couple and/or physically couple IC device features to other conductive features of MLI feature 40. For example, device-level contact 60 is a metal-to-poly (MP) contact, which generally refers to a contact to a gate structure, such as a poly gate structure or a metal gate structure. In the depicted embodiment, device-level contact 60 is disposed on gate structure 20B (in particular, metal gate stack 22B), such that device-level contact 60 connects gate structure 20B to via 70. Device-level contact 60 extends through ILD layer 44 and ESL 52, though the present disclosure contemplates embodiments where device-level contact 60 extends through more than one ILD layer and/or ESL of MLI feature 40. In furtherance of the example, device-level contact 62 and device-level contact 64 are metal-to-device (MD) contacts, which generally refer to contacts to a conductive region of integrated circuit device 10, such as source/drain regions. In the depicted embodiment, device-level contact 62 and device-level contact 64 are disposed on respective epitaxial source/drain features 30, such that device-level contact 62 and device-level contact 64 connect epitaxial source/drain features 30 respectively to via 72 and via 74. Device-level contact 62 and device-level contact 64 extend through ILD layer 42, ILD layer 44, and ESL 52, though the present disclosure contemplates embodiments where device-level contact 62 and/or device-level contact 64 extend through more than one ILD layer and/or ESL of MLI feature 40. In some implementations, device-level contacts 60-64 are MEOL conductive features that interconnect FEOL conductive features (for example, gate structures 20A-20C and/or epitaxial source/drain features 30) to BEOL conductive features (for example, vias 70-74), thereby electrically and/or physically coupling FEOL conductive features to BEOL conductive features.

Vias 70-74 and vias 90-94 electrically couple and/or physically couple conductive features of MLI feature 40 to one another. For example, via 70 is disposed on device-level contact 60, such that via 70 connects device-level contact 60 to conductive line 80; via 72 is disposed on device-level contact 62, such that via 72 connects device-level contact 62 to conductive line 82; and via 74 is disposed on device-level contact 64, such that via 74 connects device-level contact 64 to conductive line 84. Additionally, vias 90-94 are disposed on conductive lines 80,82, and 84, respectively, such that vias 90-94 connect conductive lines 80, 82, and 84 to additional conductive lines (not shown) of the MLI feature 40. In the depicted embodiment, vias 70-74 extend through ILD layer 46 and ESL 54, and vias 90-94 extend through ILD layer 48 to contact conductive lines 80-84, though the present disclosure contemplates embodiments where vias 70-74 and vias 90-94 extend through more than one ILD layer and/or ESL of MLI feature 40. In some implementations, vias 70-74 are BEOL conductive features that interconnect MEOL conductive features (for example, device-level contacts 60-64) to BEOL conductive features (for example, conductive lines 80-84), thereby electrically and/or physically coupling MEOL conductive features to BEOL conductive features. In some implementations, vias 90-94 are BEOL conductive features that interconnect BEOL conductive features in different ILD layers to one another, such as conductive lines 80-84 to conductive lines (not shown) disposed in other ILD layers (not shown) overlying ILD layers 42-48, thereby electrically and/or physically coupling BEOL conductive features of integrated circuit device 10. Device-level contacts 60-64, vias 70-74, and vias 90-94 include any suitable conductive material, such as Co, Ru, Cu, Ta, Ti, Al, TaN, TiN, other suitable conductive materials, or combinations thereof. In the depicted embodiment, vias 70-74 are formed to a thickness 76, conductive lines 80-84 are formed to a thickness 86, and vias 90-94 are formed to a thickness 96.

One process generally implemented to form a conductive line disposed over a via includes depositing a second ILD layer (such as ILD layer 48; optionally including an ESL, such as ESL 56) in which the conductive line (such as any of conductive lines 80-84) is formed, over a first ILD layer (such as ILD layer 46) in which the via (such as any of vias 70-74) is formed; performing one or more lithography and/or etching processes to provide an opening for the conductive line disposed over an opening for the via in their respective ILD layers; filling the openings by a deposition process to form the conductive line and the via, such that the conductive line and the via include the same conductive material(s); and subsequently performing one or more CMP processes to remove any excess conductive material(s). Often, a ratio of a thickness of the conductive line (such as thickness 86) to a thickness of the via (such as thickness 76 or 96) thus formed is approximately 1:1. However, as IC technologies progress towards smaller technology nodes (such as 16 nm, 10 nm, 7 nm, 5 nm, and below) and MLI features become more compact, interconnect features formed have been observed to exhibit higher aspect ratios, resistivity, and line-to-line capacitance; cause damages in surrounding ILD and/or IMD layer(s); and develop voids, collapse, and/or bend during patterning and deposition processes. Particularly, the increased aspect ratios (such as conductive lines 80-84 disposed over their respective vias 70-74) may be attributed to a feature's opening (such as opening of one or more of conductive lines 80-84) being formed to a width substantially less than a sum of a thickness (or height) of the conductive line (such as thickness 86) and a thickness of the via (such as thickness 76 or 96).

To address these challenges, IC manufacturers are seeking to improve methods of forming interconnect features with reduced aspect ratio and improved performance. According to embodiments of the present disclosure, instead of patterning to form openings (for example, by lithography and/or etching processes) and subsequently filling the openings to form conductive lines (such as conductive lines 80-84), conductive material(s) may be directly deposited over vias (such as vias 70-74) to form conductive lines having a much lower thickness, thereby reducing the overall aspect ratio of the interconnect features. In one such example, a ratio of a thickness of conductive lines (such as thickness 86) to a thickness of vias (such as thickness 76 or 96) may be reduced from about 1:1 to about 1:2. In a further example, such ratio may be reduced from about 1:1 to about 1:10. If the ratio is greater than about 1:2, challenges discussed above with respect to the device's electrical performance and structural integrity may persist. On the other hand, if the ratio is less than about 1:10, the thickness of the conductive line may be too small such that electron scattering may in fact increase the resistivity of the conductive line. In fact, a slight decrease of the ratio, e.g., from about 1:10 to about 1:10.1, may significantly increase the resistivity of the conductive line, negatively impacting the device's performance enormously.

Accordingly, embodiments of the present disclosure present many advantages. For example, reducing the aspect ratio of the interconnect features helps mitigate issues related to the formation of voids, collapsing, and/or bending that may occur during the patterning processes. Additionally, by reducing thickness of conductive lines, a capacitance of IC device may be reduced, leading to reduction in the overall RC delay of the IC device. By bypassing patterning ILD layers (such as ILD layer 48) to form conductive lines, damage caused by etchant gases and/or plasmas may also be minimized, thereby further reducing the capacitance of the IC device. Still further, by implementing materials (such as Ru and Co) having lower resistivity than copper in conductive lines and/or vias, the resistivity (and thus the overall RC delay) of the IC device may also be reduced.

Figure 2A:
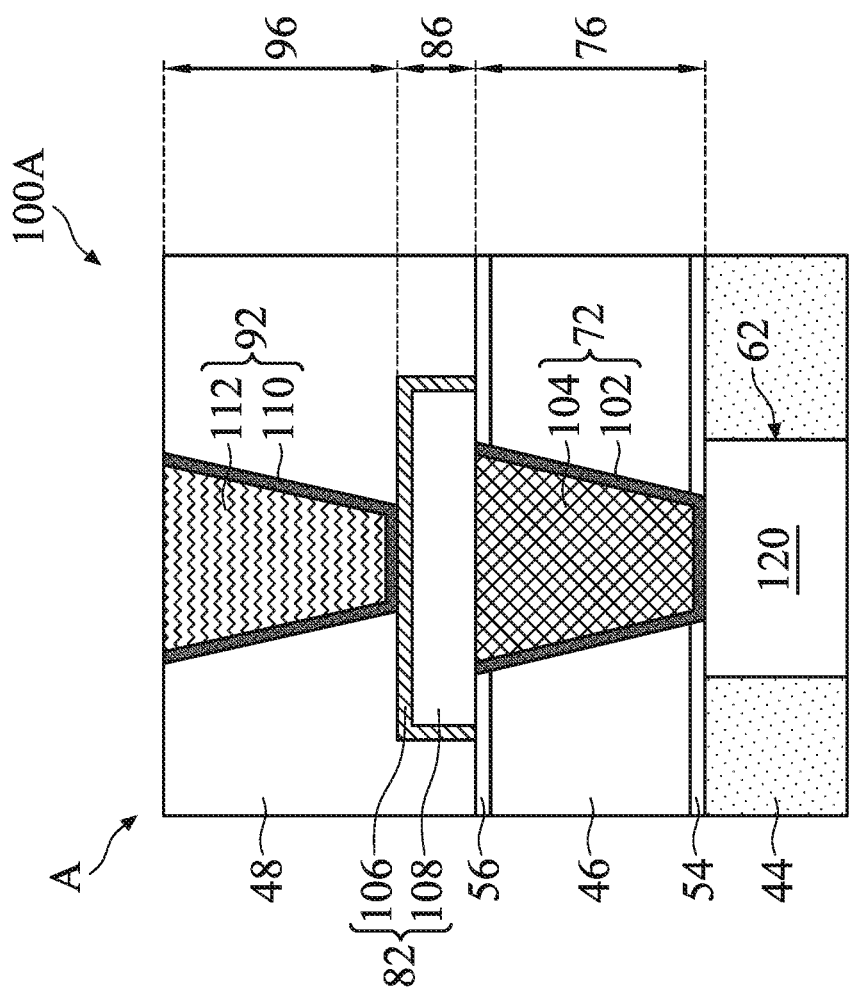
FIG. 2A is an enlarged fragmentary diagrammatic view of the integrated circuit device of FIG. 1 when implementing an interconnect structure, in portion or entirety, according to various aspects of the present disclosure.

FIG. 2A is an enlarged fragmentary diagrammatic view of a portion A of integrated circuit device 10 when implementing an interconnect structure 100A, in portion or entirety, according to various aspects of the present disclosure. Interconnect structure 100A includes device-level contact 62, via 72, conductive line 82, and via 92, where via 72 extends through ILD layer 46, ESL 54, and ESL 56 to interconnect device-level contact 62 to conductive line 82, and via 92 extends through ILD layer 48 to interconnect conductive line 82 to additional conductive layers formed over via 92. In some implementations, ESL 54 and/or ESL 56 are omitted from interconnect structure 100A. FIG. 2A has been simplified for the sake of clarity to better understand the inventive concepts of the present disclosure. Additional features may be added in interconnect structure 100A, and some of the features described below may be replaced, modified, or eliminated in other embodiments of interconnect structure 100A.

In FIG. 2A, device-level contact 62 is disposed in ILD layer 44. A bottom surface of via 72 and ILD layer 46 (and/or ESL 54) is disposed on a top surface of device-level contact 62 and ILD layer 44 is disposed on sidewalls of device-level contact 62. Though not depicted in FIG. 2A, a bottom of device-level contact 62 extends through ILD layer 42 and ESL 52 to contact epitaxial source/drain features 30, as shown in FIG. 1. Device-level contact 62 includes a conductive bulk layer 120 comprising any suitable conductive material, such as Co, Ru, Cu, W, Ta, Ti, Al, TaN, TiN, other suitable conductive materials, or combinations thereof. Though not depicted, in some implementations, device-level contact 62 may further include other material layers, such as capping layers, barrier layers, adhesion layers, other suitable material layers, or combinations thereof.

Via 72 fills a via opening having sidewalls defined by ILD layer 46, ESL 54, and ESL 56, and a bottom surface defined by the top surface of device-level contact 62 (or topmost material layer included therein). Via 72 interconnects conductive line 82 to device-level contact 62. Via 72 includes a via bulk layer 104 comprising any suitable conductive material, such as Co, Ru, Cu, nanotube, two-dimensional materials (e.g., graphene), binary alloys, ternary alloys, metallic compounds (including, for example, Sc, V, Cr, Zr, Nb, Mo, Hf, Al, Si, P, S, Ga, Ge, As, Cd, In, Sn, Tl, Pb, C, N, or combinations thereof), other suitable conductive materials, or combinations thereof. In the depicted embodiment, via 72 further includes a via barrier layer 102 disposed between via bulk layer 104 and surfaces defining via 72, such as sidewall surfaces defined by ILD layer 46, ESL 54, and ESL 56, and the bottom surface defined by top surface(s) of device-level contact 62 (or topmost material layer included therein). In some embodiments, via barrier layer 102 is selectively deposited on sidewall surfaces defined by ILD layer 46. Via barrier layer 102 may be configured to facilitate adhesion of via bulk layer 104 to device-level contact 62, conductive line 82, and/or ILD layer 46. In the depicted embodiment, via 72 has a thickness (or height) 76, which is measured from the bottom surface of via 72 defined by device-level contact 62 to the top surface of via 72 defined by conductive line 82. In the depicted embodiment, thickness 76 is measured from a bottom surface of via barrier layer 102 to a top surface of via bulk layer 104. In some examples, thickness 76 is from about 2 nm to about 200 nm.

Via barrier layer 102 may include titanium, tantalum, tungsten, cobalt, manganese, nitrogen, self-assembled monolayers including silane, silanol, or silyl hydride, other suitable materials, or combinations thereof. For example, via barrier layer 102 includes TiN, TaN, WN, CoN, MnN, other suitable materials, or combinations thereof. In many implementations, via barrier layer 102 prevents chemicals from diffusing into, attacking and/or consuming device-level contact 62 during subsequent processing. In the depicted embodiment, via barrier layer 102 has a thickness of less than about 50 nm.

Conductive line 82 is disposed over via 72, for example, on via barrier layer 102 and via bulk layer 104, and ILD layer 46 (and/or or ESL 56). A bottom surface of via 92 is disposed over a top surface of conductive line 82, and ILD layer 48 is disposed on sidewalls of conductive line 82. Conductive line 82 includes a conductive bulk layer 108 and a barrier layer 106. In the depicted embodiment, barrier layer 106 is disposed over a top surface and on sidewall surfaces of the conductive bulk layer 108. Conductive bulk layer 108 includes any suitable conductive material, such as Co, Ru, two-dimensional materials (e.g., graphene), nanotube, binary alloys, ternary alloys, metallic compounds (including, for example, Sc, V, Cr, Zr, Nb, Mo, Hf, Al, Si, P, S, Ga, Ge, As, Cd, In, Sn, Tl, Pb, C, N, or combinations thereof), other suitable conductive materials, or combinations thereof. In the present embodiments, conductive bulk layer 108 includes Ru and/or Co. Further to the depicted embodiment, a thickness 86 of conductive line 82 is about 1 nm to about 20 nm. Compared to commonly used conductive material Cu, Ru and Co possess lower resistivity than Cu because the mean-free path (MFP) of Ru and Co are smaller than that of Cu at small length scales (e.g., less than bout 20 nm), which may help reduce electron scattering at grain boundaries, leading to improved electrical properties. In some embodiments, conductive bulk layer 108 includes a conductive material different from that of via bulk layer 104. In one example, via bulk layer 104 includes Cu, and conductive bulk layer 108 includes Ru. In another example, via bulk layer 104 includes Co, and conductive bulk layer 108 includes Ru.

In the depicted embodiment, barrier layer 106 is selectively deposited on exposed surfaces of conductive bulk layer 108, and may be formed to a thickness of less than about 50 nm. Barrier layer 106 may be similar to via barrier layer 102 in composition and may include titanium, tantalum, tungsten, cobalt, manganese, nitrogen, other suitable materials, or combinations thereof. For example, barrier layer 106 includes TiN, TaN, WN, CoN, MnN, other suitable materials, or combinations thereof. In the depicted embodiment, conductive line 82 has a thickness (or height) 86, which is measured from the bottom surface of conductive line 82 defined by the top surface of via 72 and/or ILD layer 46 (and/or ESL 56) to the top surface of conductive line 82 (such as a top surface of barrier layer 106) defined by ILD layer 48 and the bottom surface of via 92. In some examples, thickness 86 is from about 1 nm to about 20 nm. In furtherance of embodiments, a ratio of thickness 86 to thickness 76 is about 1:2 to about 1:10.

As discussed above, the process generally implemented for forming MLI features such as conductive line 82 and via 72 includes patterning ILD layers to form openings for a via and a conductive line disposed over the via and depositing conductive material to fill the openings to form the via and the conductive line. A ratio of a thickness of the conductive line to a thickness of the via thus formed is approximately 1:1. A reduction in this ratio from about 1:1 to about 1:2 or even to about 1:10 (due to, for example, reduced thickness of the conductive line) signifies a reduction in overall aspect ratio of the MLI features. Such reduction offers many advantages. In one example, reduced aspect ratio reduces occurrence of issues involving line distortion and/or line collapse of the MLI features that typically occurs during patterning process. In another example, reduced aspect ratio lowers line-to-line capacitance of the MLI features, thereby reducing RC delay of the overall device.

Via 92 fills a via opening having sidewalls defined by ILD layer 48 and a bottom surface defined by the top surface of conductive line 82, for example, barrier layer 106. Via 92 includes a via bulk layer 112 comprising conductive material(s) similar to that of via bulk layer 104 included in via 72, and a via barrier layer 110 disposed between via bulk layer 112 and surfaces defining via 92, such as the sidewalls defined by ILD layer 48 and the bottom surface defined by the top surface of conductive line 82 (such as barrier layer 106). In some embodiments, via barrier layer 110 is selectively deposited on sidewall surfaces defined by ILD layer 48. Via barrier layer 110 may be similar to via barrier layer 102 formed in via 72 and may be configured to facilitate adhesion of via bulk layer 112 to conductive line 82 and/or ILD layer 48. In the depicted embodiment, via 92 has a thickness (or height) 96, which is measured from the bottom surface of via 92 defined by the top surface of conductive line 82 to a top surface of via 92 defined by a top surface of via 92 (such as a top surface of via bulk layer 112). In the depicted embodiment, thickness 96 is measured from a bottom surface of via barrier layer 110. In some embodiments, a ratio of thickness 86 to thickness 96 is about 1:2 to about 1:10. In the depicted embodiment, via barrier layer 110 has a thickness of less than about 50 nm.

Figure 2C:
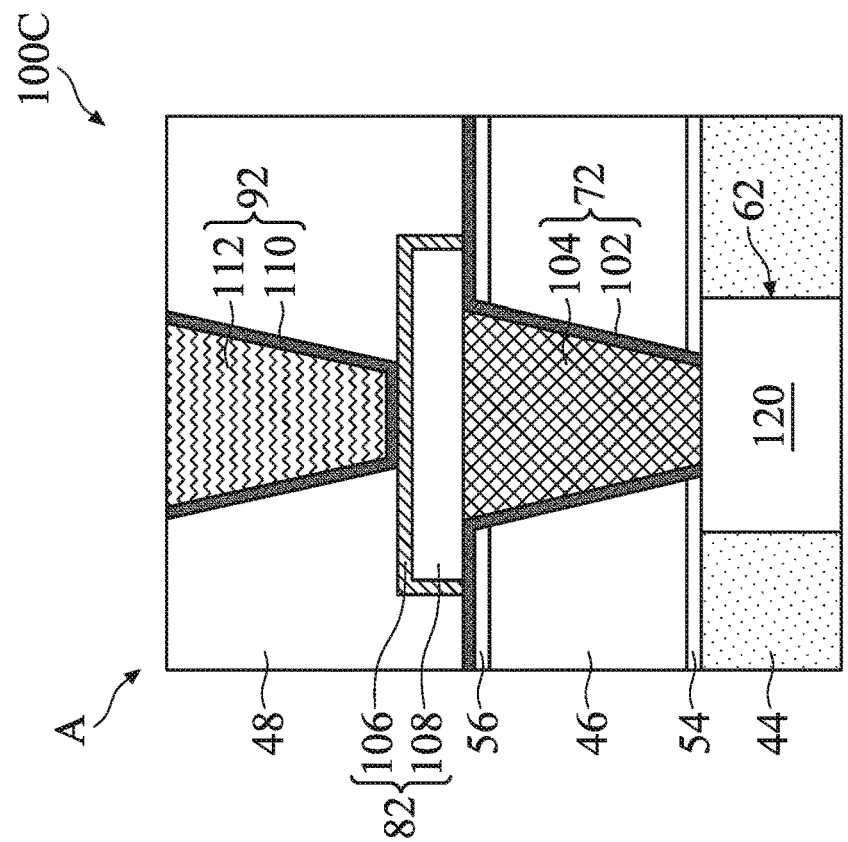
FIG. 2C is an enlarged fragmentary diagrammatic view of the integrated circuit device of FIG. 1 when implementing yet another interconnect structure, in portion or entirety, according to various aspects of the present disclosure.
Figure 2B:
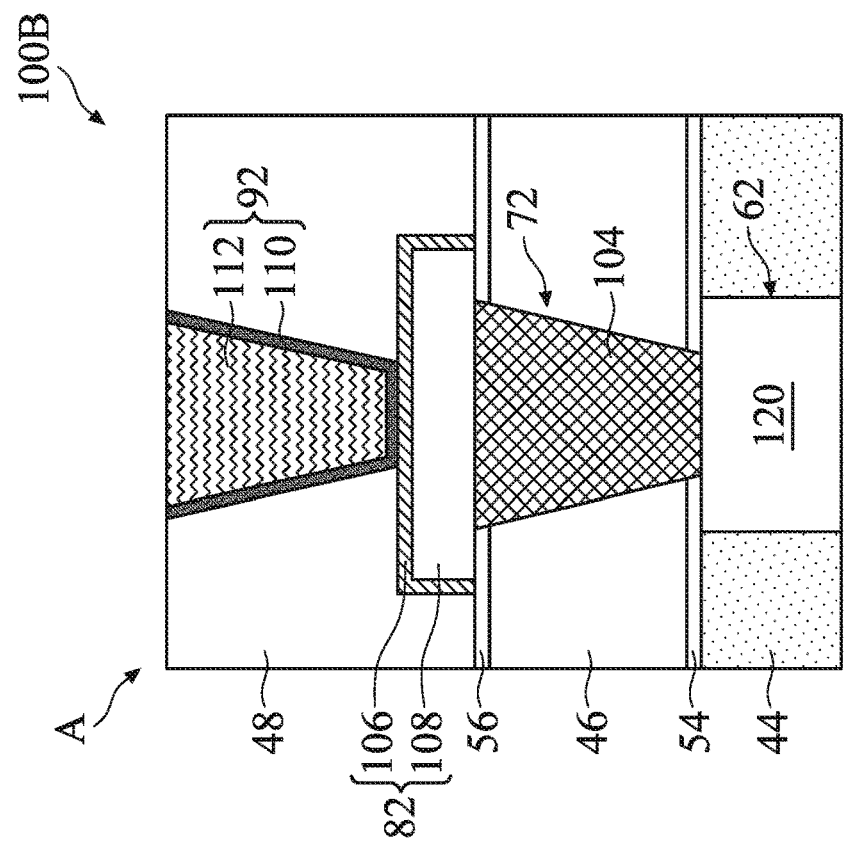
FIG. 2B is an enlarged fragmentary diagrammatic view of the integrated circuit device of FIG. 1 when implementing another interconnect structure, in portion or entirety, according to various aspects of the present disclosure.

FIG. 2B is an enlarged fragmentary diagrammatic view of portion A of integrated circuit device 10 when implementing an interconnect structure 100B, in portion or entirety, according to various aspects of the present disclosure. Interconnect structure 100B is similar to interconnect structure 100A, except via barrier layer 102 is omitted in via 72. Via 72 thus fills a via opening having sidewalls defined by ILD layer 46 and/or ESL 54 and a bottom surface defined by conductive bulk layer 120 of device-level contact 62. For example, in embodiments where via bulk layer 104 includes Co and/or Ru, via barrier layer 102 may be omitted as chemical diffusion from via bulk layer 104 is not extensive when via bulk layer 104 includes Co and/or Ru instead of Cu. In some implementations, via barrier layer 102 is also omitted in via 92 if Co and/or Ru is included therein. Similar to interconnect structure 100A, ESLs 54 and/or 56 may be omitted in interconnect structure 100B. FIG. 2B has been simplified for the sake of clarity to better understand the inventive concepts of the present disclosure. Additional features may be added in interconnect structure 100B, and some of the features described below may be replaced, modified, or eliminated in other embodiments of interconnect structure 100B.

FIG. 2C is an enlarged fragmentary diagrammatic view of portion A of integrated circuit device 10 when implementing an interconnect structure 100C, in portion or entirety, according to various aspects of the present disclosure. Interconnect structure 100C is similar to interconnect structure 100A, except via barrier layer 102 is disposed on sidewall surfaces defined by ILD layer 46, as well as on a portion of a top surface of ILD layer 46 and/or ESL 56. In contrast, in FIG. 2A, via barrier layer 102 is disposed on the top surface of device-level contact 62 and sidewall surfaces defined by ILD layer 46 as depicted in interconnect structure 100A. Specifically, conductive bulk layer 108 is deposited over via bulk layer 104 and portions of via barrier layer 102. In the depicted embodiment, via barrier layer 102 includes TiN, TaN, WN, CoN, MnN, self-assembled monolayers including silane, silanol, or silyl hydride, other suitable material, or combinations thereof. Via 72 thus fills a via opening having sidewalls defined by via barrier layer 102 and a bottom defined by the top surface of device-level contact 62 (such as the top surface of conductive bulk layer 120). FIG. 2C has been simplified for the sake of clarity to better understand the inventive concepts of the present disclosure. Additional features may be added in interconnect structure 100C, and some of the features described below may be replaced, modified, or eliminated in other embodiments of interconnect structure 100C.

Figure 3A:
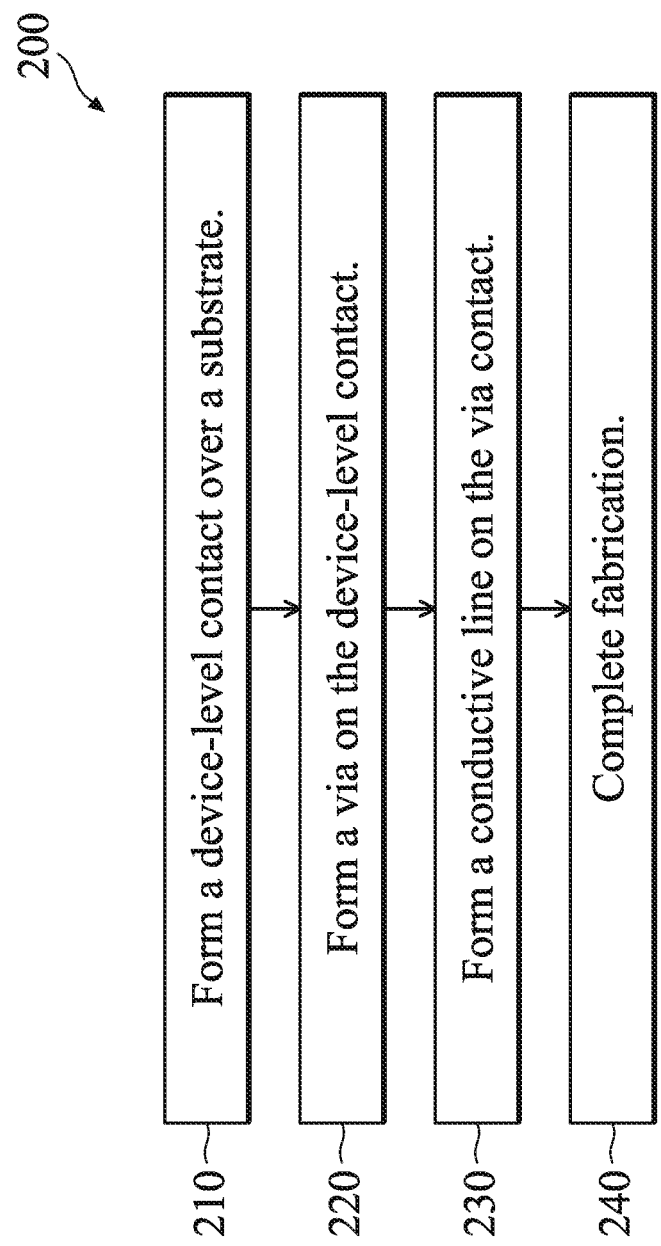
FIG. 3A is a flow chart of a method for fabricating an interconnect structure, such as the interconnect structures depicted in FIG. 1 and/or FIGS. 2A-2C, according to various aspects of the present disclosure.

FIG. 3A is a flow chart of a method 200 for fabricating an interconnect structure, such as interconnect structures 100A-100C in FIGS. 2A-2C, according to various aspects of the present disclosure. At block 210, method 200 includes forming a device-level contact over a substrate. At block 220, a via is formed on the device-level contact. At block 230, a conductive line is formed on the via. At block 240, the method 200 may continue to complete fabrication of the interconnect structure. Additional steps may be provided before, during, and after method 200, and some of the steps described may be moved, replaced, or eliminated for additional embodiments of method 200.

Figure 3B:
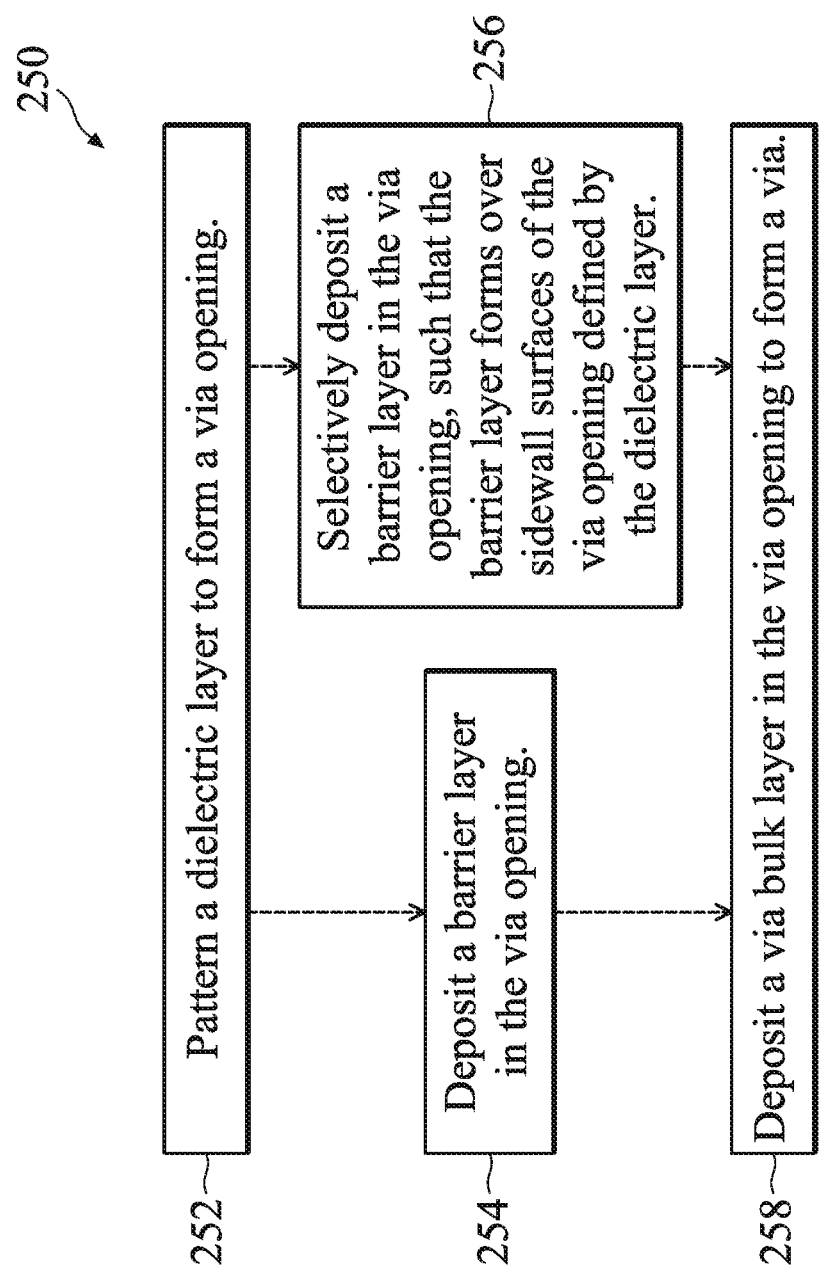
FIG. 3B is a flow chart of a method for fabricating a via of an interconnect structure, such as the interconnect structures depicted in FIG. 1 and/or FIGS. 2A-2C, according to various aspects of the present disclosure.

FIG. 3B is a flow chart of a method 250 for fabricating a via of an interconnect structure, such as vias 72 and 92 of interconnect structures 100A-100C in FIGS. 2A-2C, according to various aspects of the present disclosure. In some implementations, method 250 may be implemented in method 200 at block 220. At block 252, method 250 includes forming an opening in a dielectric layer overlying a conductive feature, such as device-level contact 62 of interconnect structures 100A-100C in FIGS. 2A-2C. At block 254, a via barrier layer is formed on sidewall surfaces and a bottom surface of the opening. Alternatively, at block 256, the via barrier layer is selectively formed on sidewall surfaces of the opening defined by the dielectric layer. Thereafter, at block 258, a via bulk layer is formed on the via barrier layer, such that the via barrier layer and the via bulk layer fill the opening and form the via. In some embodiments, block 254 and block 256 are omitted, such that no via barrier layer is formed in the opening (such as the embodiment depicted in FIG. 2B). As such, the via bulk layer may be directly formed on sidewall surfaces of the opening defined by the dielectric layer and the device-level contact. Additional steps may be provided before, during, and after method 250, and some of the steps described may be moved, replaced, or eliminated for additional embodiments of method 250.

Figure 3C:
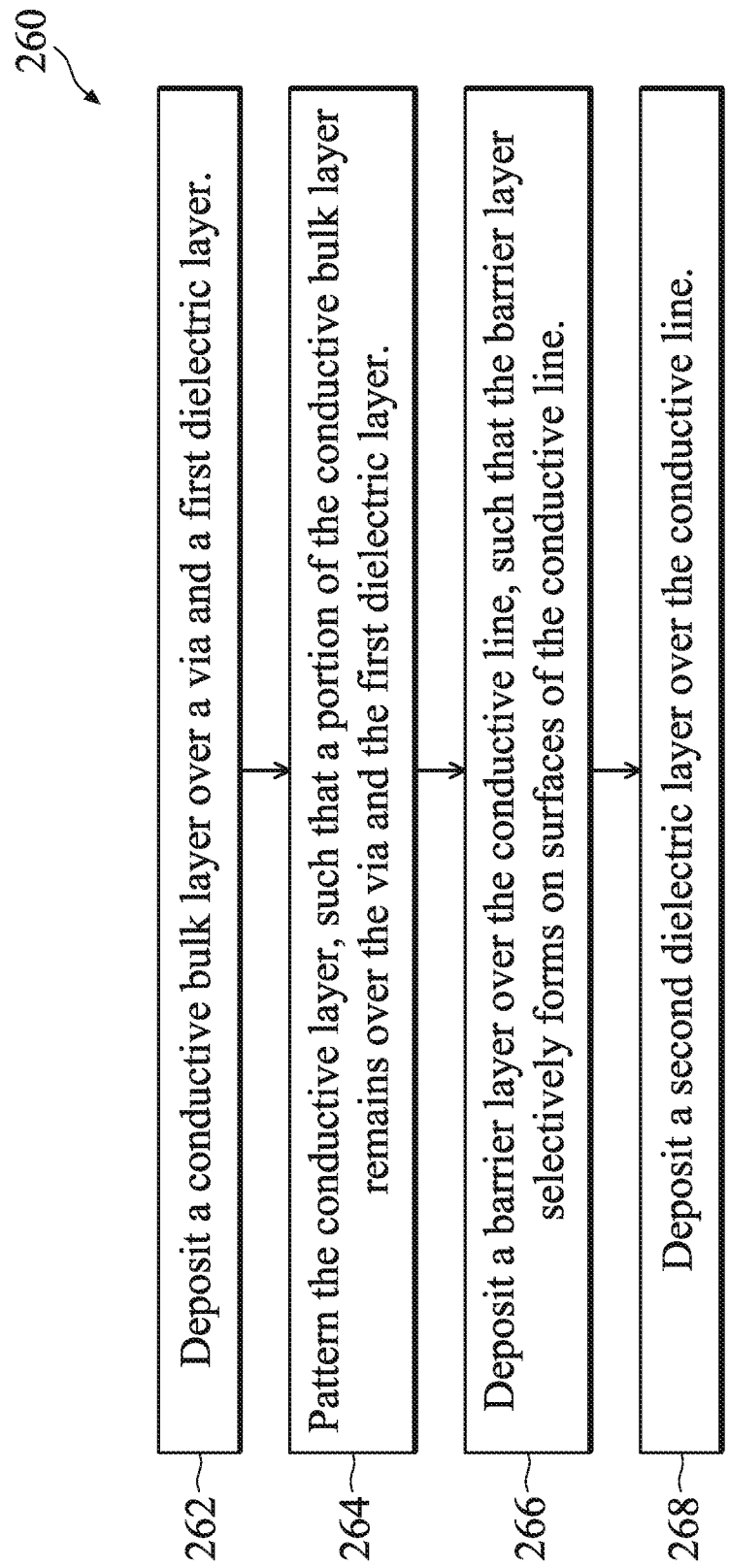
FIG. 3C is a flow chart of a method for fabricating a conductive line of an interconnect structure, such as the interconnect structures depicted in FIG. 1 and/or FIGS. 2A-2C, according to various aspects of the present disclosure.

FIG. 3C is a flow chart of a method 260 for fabricating a conductive line of an interconnect structure, such as conductive line 82 of interconnect structures 100A-100C in FIGS. 2A-2C, according to various aspects of the present disclosure. In some implementations, method 260 may be implemented in method 200 at block 230. At block 262, method 260 includes depositing a conductive bulk layer over the via formed at block 258 of method 250. At block 264, the conductive bulk layer is patterned, for example, by a series of lithography and/or etching processes, such that a portion of the conductive bulk layer remains over a top surface of the via and a top surface of the dielectric layer in which the via is formed. At block 266, a barrier layer is formed over the remaining conductive bulk layer, resulting in a conductive line. In the depicted embodiment, the barrier layer is selectively formed over surfaces of the conductive line, details of such selective deposition are discussed below. Thereafter, at block 268, a dielectric layer is formed over the conductive line. Additional steps may be provided before, during, and after method 250, and some of the steps described may be moved, replaced, or eliminated for additional embodiments of method 250.

FIGS. 4-13 are fragmentary diagrammatic views of an interconnect structure 300, in portion or entirety, at various fabrication stages (such as those associated with method 200 of FIG. 3A, method 250 of FIG. 3B, and/or method 260 of FIG. 3C) according to various aspects of the present disclosure. FIGS. 4-13 have been simplified for the sake of clarity to better understand the inventive concepts of the present disclosure. Additional features may be added in interconnect structure 300, and some of the features described below may be replaced, modified, or eliminated in other embodiments of interconnect structure 300.

Figure 4:
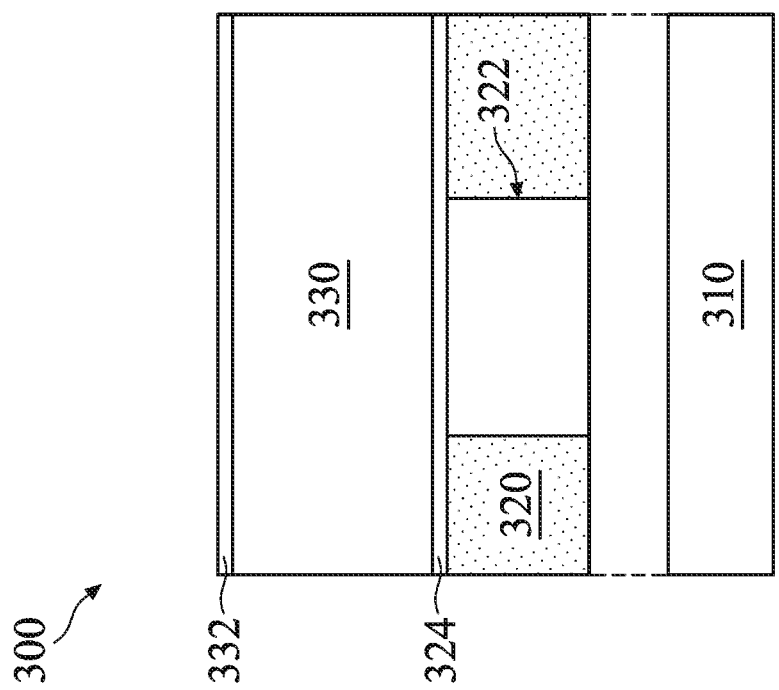

In FIG. 4, referring to block 252, a substrate 310 is provided having a conductive feature 322 disposed thereover. Substrate 310 is similar to substrate 12 depicted and described in FIG. 1. In the depicted embodiment, conductive feature 322 is a MEOL feature similar to device-level contact 62 depicted and described in FIG. 1 and FIGS. 2A-2C. For example, conductive feature 322 includes a conductive bulk layer (not depicted) similar to conductive bulk layer 120 depicted and described in FIGS. 2A-2C. Alternatively, in some implementations, conductive feature 322 is a BEOL feature, such as conductive line 82 of MLI feature 40. In the depicted embodiment, conductive feature 322 is formed in a dielectric layer 320, which is similar to ILD layers 42-48 depicted and described in FIG. 1 and FIGS. 2A-2C. In some implementations, conductive feature 322 is formed by any suitable deposition process (for example, PVD, CVD, ALD, or other suitable deposition process) and/or annealing process.

A dielectric layer 330, similar to ILD layers 42-48 depicted and described in FIG. 1 and FIGS. 2A-2C, is formed over conductive feature 322. For example, CVD, PECVD, spin-on dielectric, other suitable process, or combinations thereof is performed to deposit a low-k dielectric material over conductive feature 322, thereby forming dielectric layer 330. As depicted, ESL 324, similar to ESLs 52-56 depicted and described in FIG. 1 and FIGS. 2A-2C, may be formed over dielectric layer 320 and conductive feature 322 before forming dielectric layer 330, and ESL 332 may be formed over dielectric layer 330, though the present disclosure contemplates embodiments where ESLs 324 and/or 332 are omitted from interconnect structure 300. ESLs 324 and 332 each include a material having a different etching characteristic than a material of dielectric layer 330, such as silicon nitride.

Figure 5:
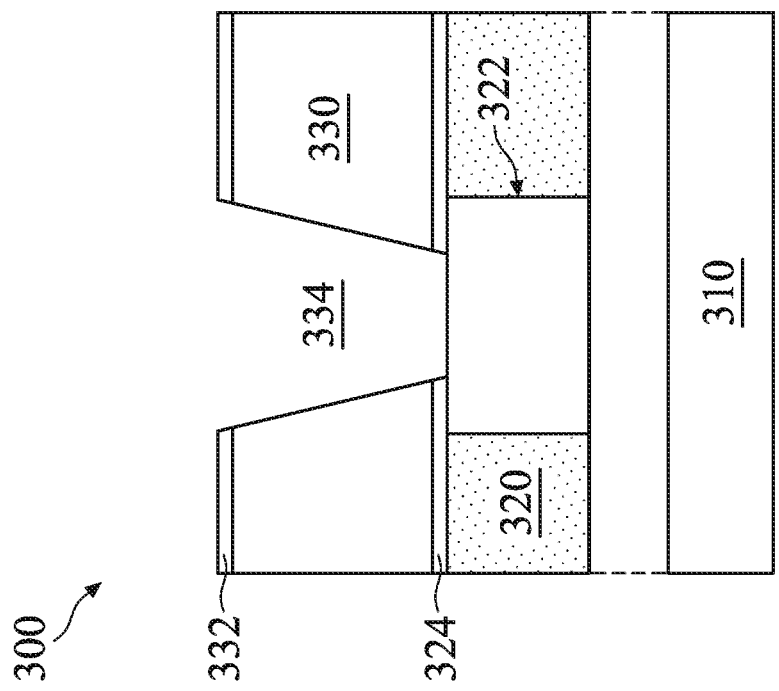
FIGS. 4, 5, 6, 7, 8, 9, 10, 11, 12, 13A, 13B, 14, 15, and 16 are fragmentary diagrammatic views of an interconnect structure, in portion or entirety, at various fabrication stages (such as those associated with the method of FIGS. 3A, 3B, and/or 3C) according to various aspects of the present disclosure.

In FIG. 5, referring to block 254, a via opening 334 is formed in dielectric layer 330 (and, in some implementations, ESL 324, and/or ESL 332) by a patterning process. In the depicted embodiment, via opening 334 extends through ESL 332, dielectric layer 330, and ESL 324. Via opening 334 has sidewalls defined by dielectric layer 330 (and ESL 324 and/or ESL 332) and a bottom surface defined by conductive feature 322. The patterning process includes lithography processes and/or etching processes. For example, forming via opening 334 includes performing a lithography process to form a patterned resist layer over dielectric layer 330 and performing an etching process to transfer a pattern defined in the patterned resist layer to dielectric layer 330. The lithography process may include forming a resist layer on dielectric layer 330 (for example, by spin coating), performing a pre-exposure baking process, performing an exposure process using a mask, performing a post-exposure baking process, and performing a developing process. During the exposure process, the resist layer is exposed to radiation energy (such as ultraviolet (UV) light, deep UV (DUV) light, or extreme UV (EUV) light), where the mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask. The etching process uses the patterned resist layer as an etch mask to remove portions of dielectric layer 330. The etching process may include a dry etching process (for example, a reactive ion etching (RIE) process), a wet etching process, other suitable etching process, or combinations thereof. After the etching process, the patterned resist layer is removed from dielectric layer 330, for example, by a resist stripping process. In some implementations, the patterned resist layer is used as an etch mask to remove portions of ESL 324 and/or ESL 332 to extend via opening 334, thereby exposing conductive feature 322. Various selective etching processes may be performed. Alternatively, the exposure process may be implemented or replaced by other methods, such as maskless lithography, electron-beam (e-beam) writing, ion-beam writing, and/or nanoimprint technology.

Figure 6:
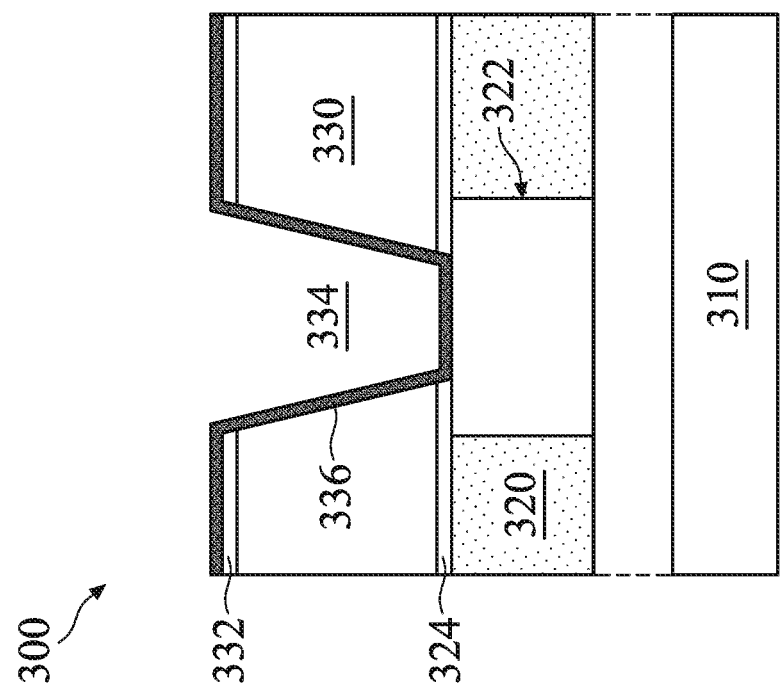

In FIG. 6, referring to block 254, a via barrier layer 336 is formed in via opening 334. Via barrier layer 336 is similar to via barrier layer 102 depicted and described in FIGS. 2A-2C. For example, via barrier layer 336 includes TiN, TaN, WN, CoN, MnN, other suitable material, or combinations thereof. Via barrier layer 336 is disposed along sidewall and bottom surfaces that define via opening 334, such that via barrier layer 336 partially fills via opening 334. In the depicted embodiment, via barrier layer 336 is disposed directly on portions of dielectric layer 330 and conductive feature 322 that define via opening 334, as well as over a top surface of ESL 332. In furtherance of the depicted embodiment, via barrier layer 336 is conformally deposited in via opening 334, such that via barrier layer 336 has a thickness that is substantially uniform over exposed surfaces of interconnect structure 300. Still further, the depicted embodiment provides that via barrier layer 336 is formed by PVD, CVD, ALD, electroless deposition, other suitable deposition process, or combinations thereof.

Figure 7:
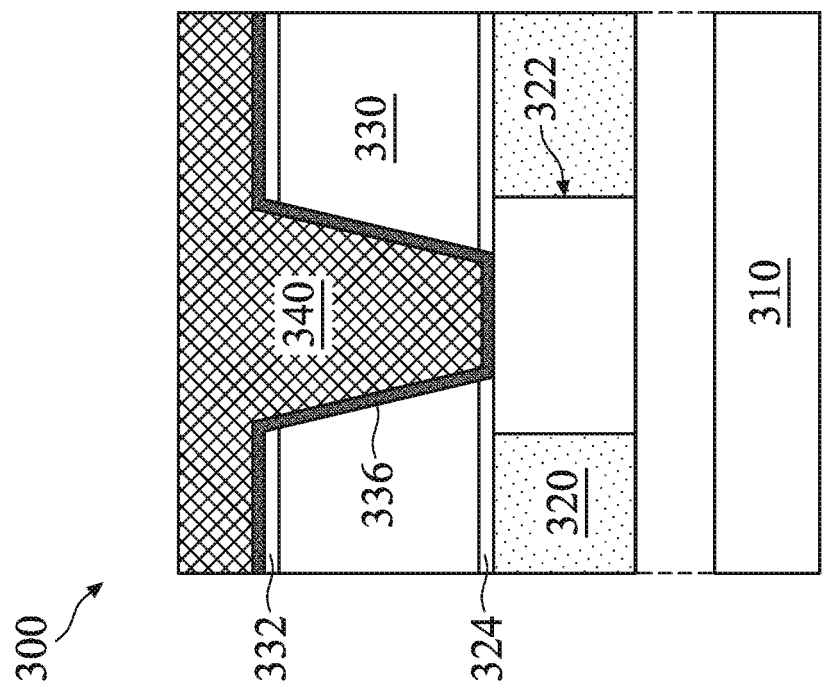

In FIG. 7, referring to block 258 and further to the embodiment depicted in FIG. 2A, a via bulk layer 340 is formed in via opening 334. Via bulk layer 340 is similar to via bulk layer 104 depicted and described in FIGS. 2A-2C. Via bulk layer 340 may include Ru, Co, Cu, graphene, nanotube, two-dimensional materials (e.g., graphene), other suitable materials, or combinations thereof as discussed above. Via bulk layer 340 may further include a seed layer, such as a Cu-containing seed layer. In the depicted embodiment, via bulk layer 340 includes a conductive material having a lower resistivity than copper, such as Co and/or Ru. Via bulk layer 340 is formed over via barrier layer 336, such that via bulk layer 340 fills any remaining space in via opening 334. In some embodiments where via bulk layer 340 includes Ru and/or Co, via barrier layer 336 is omitted, such that via bulk layer 340 directly contacts dielectric layer 330, an embodiment similar to that depicted and discussed with respect to FIG. 2B. In the depicted embodiment, via bulk layer 340 is formed by PVD, CVD, ALD, electroplating, electroless deposition, plasma laser deposition, other suitable deposition process, or combinations thereof.

Figure 8:
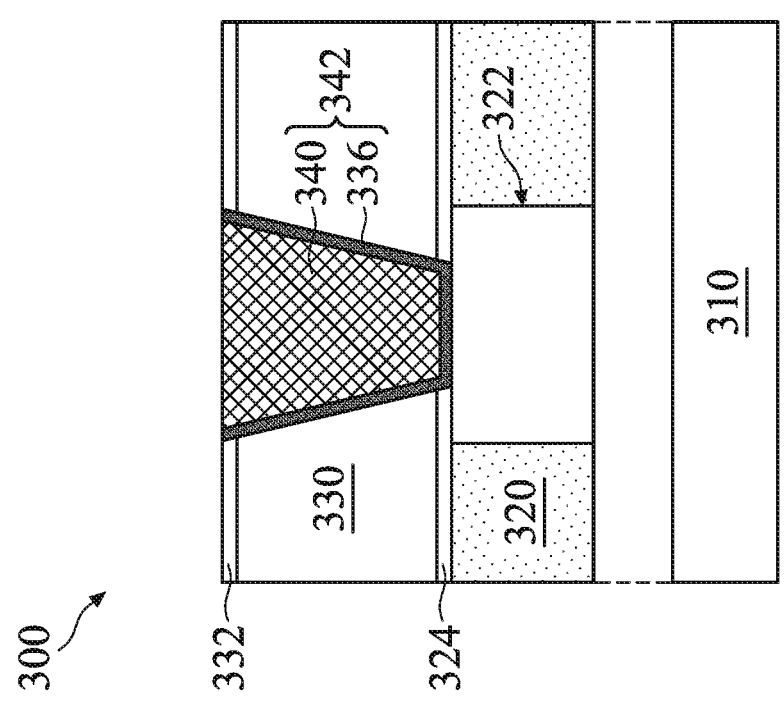

In FIG. 8, a CMP process and/or other planarization process is performed on interconnect structure 300. The CMP process removes excessive via barrier layer 336 and/or via bulk layer 340, resulting in a via 342 that includes via barrier layer 336 and via bulk layer 340 (which together fill via opening 334). In the depicted embodiment, the CMP process removes via barrier layer 336 formed over a top surface of ESL 332 (or dielectric layer 330 if ESL 332 is omitted), such that a top surface of ESL 332 and a top surface of via 342 form a substantially planar surface. However, in some embodiments, via barrier layer 336 formed over the top surface of ESL 332 is not completely removed by the CMP process, and would remain in interconnect structure 300 in subsequent processing steps until portions of it would be removed when conductive bulk layer 350 is etched to form a patterned conductive bulk layer 352 as discussed in detail below. The resulting structure is depicted and discussed in FIG. 2C.

Figure 9:
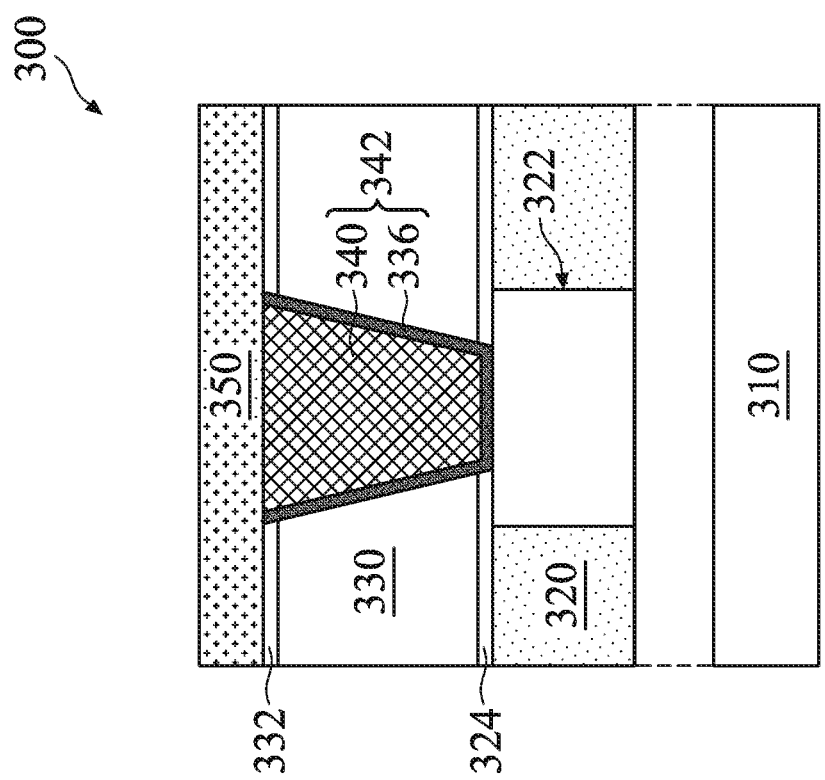

In FIG. 9, referring to block 262, a conductive bulk layer 350 is deposited over the top surface of via 342 and ESL 332. Conductive bulk layer 350 is similar to conductive bulk layer 108 depicted and described in FIGS. 2A-2C. In the depicted embodiment, conductive bulk layer 350 includes Ru and/or Co. Further to the depicted embodiment, conductive bulk layer 350 is free of Cu. Conductive bulk layer 350 may be formed by PVD, CVD, ALD, electroplating, electroless deposition, plasma laser deposition, other suitable deposition process, or combinations thereof. In some embodiments, conductive bulk layer 350 is formed to a thickness that ranges from about 1 nm to about 20 nm, similar to thickness 86 depicted and described in FIG. 2A.

Figures 10, 11:
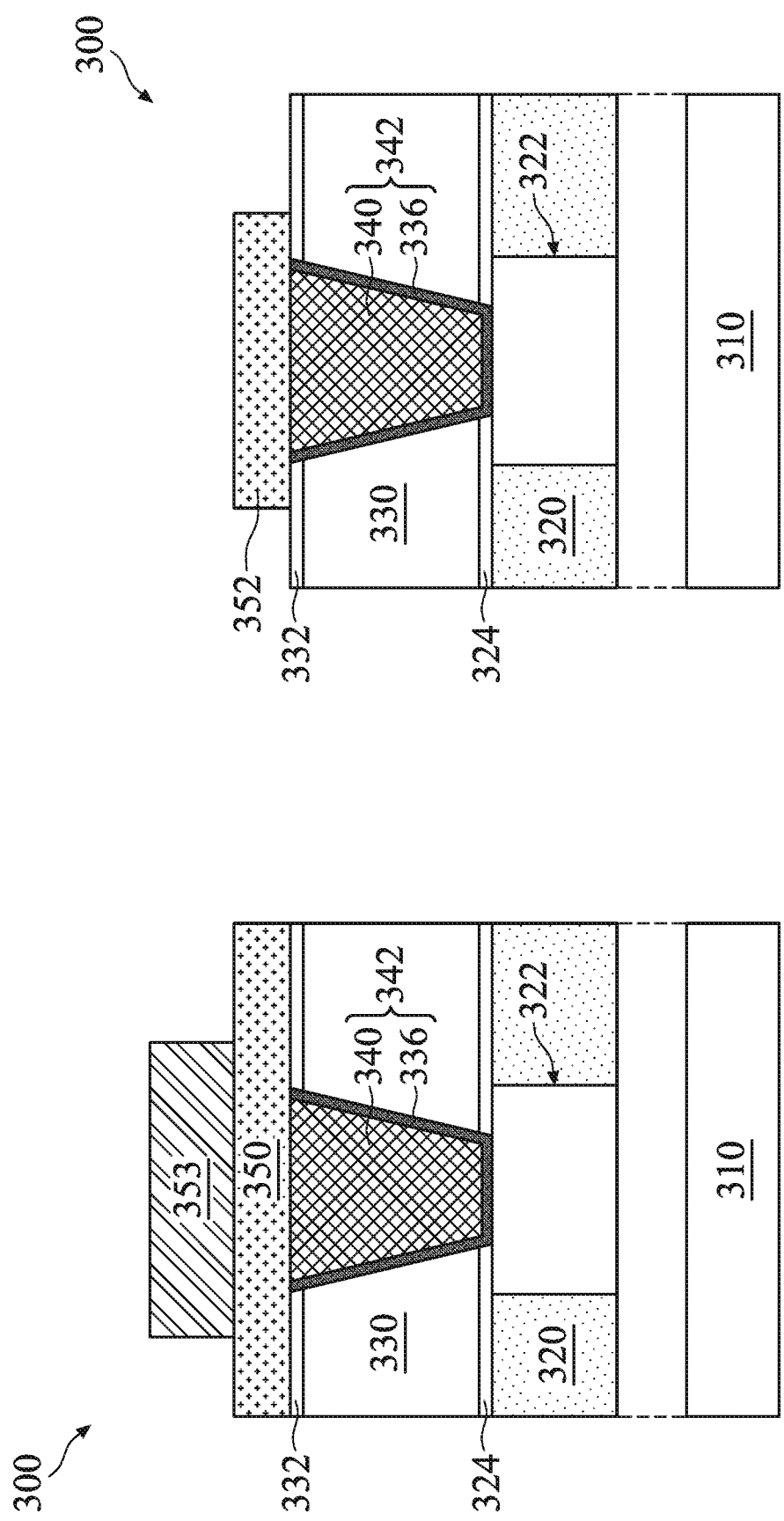

In FIG. 10, referring to block 264, conductive bulk layer 350 is patterned by implementing lithography processes and/or etching processes. For example, patterning conductive bulk layer 350 includes performing a lithography process to form a patterned masking layer 353 over conductive bulk layer 350 and performing an etching process to transfer a pattern defined in patterned masking layer 353 to conductive bulk layer 350, similar to the lithography and etching processes described herein with respect to block 252. In some embodiments, patterned masking layer 353 includes a hard mask layer (not depicted) disposed over conductive bulk layer 350 and a resist layer (not depicted) disposed over the hard mask layer. In the depicted embodiment, conductive bulk layer 350 is etched using the patterned masking layer 353 as an etch mask. Further to the depicted embodiment, conductive bulk layer 350 is etched in a dry etching process that implements an etchant including a chlorine-containing gas (e.g., $Cl_2$, $SiCl_4$, $BCl_3$, other chlorine-containing gases, or combinations thereof), an oxygen-containing gas (e.g., $O_2$, other oxygen-containing gas, or combinations thereof), an argon-containing gas (e.g., Ar gas), a helium-containing gas (e.g., He gas), a fluorine-containing gas (e.g., $CF_4$, $CHF_3$, $CH_3F$, $CH_2F_2$, $C_4F_8$, $C_4F_6$, other fluorine-containing gases, or combinations thereof), other suitable gases, or combinations thereof. In the present embodiments, conductive bulk layer 350 that includes Ru and/or Co is etched by an etchant that includes a chlorine-containing gas and/or an oxygen-containing gas as discussed herein. In some implementations, the dry etching process is performed at a temperature of about 25 degrees Celsius to about 400 degrees Celsius. The patterned masking layer 353 is subsequently removed from conductive bulk layer 350. In the depicted embodiment, referring to FIG. 11, a portion of conductive bulk layer 350 remains over the top surface of via 342, dielectric layer 330, and/or ESL 332 to form a patterned conductive bulk layer 352.

Figure 12:
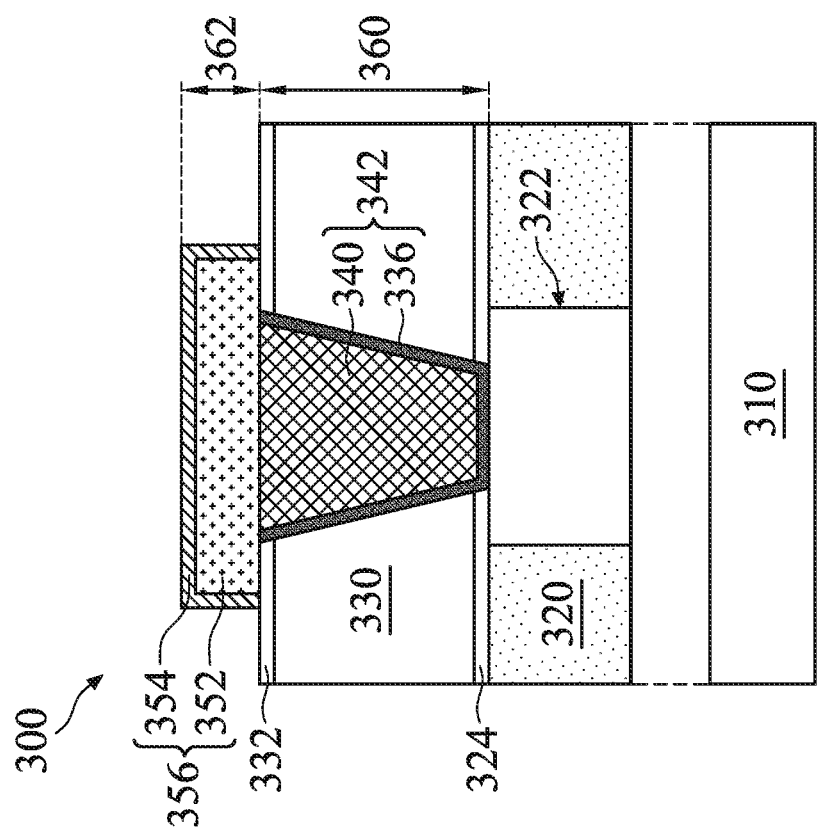

In FIG. 12, referring to block 266, a barrier layer 354 is deposited over patterned conductive bulk layer 352, resulting in a conductive line 356 similar to conductive line 82 depicted and described in FIG. 1 and FIGS. 2A-2C. Barrier layer 354 is similar to barrier layer 106 depicted and described in FIGS. 2A-2C. For example, barrier layer 354 includes TiN, TaN, WN, CoN, MnN, other suitable material, or combinations thereof. Barrier layer 354 is disposed on sidewall and top surfaces, i.e., exposed surfaces, of patterned conductive bulk layer 352. In the depicted embodiment, barrier layer 354 is conformally deposited over patterned conductive bulk layer 352, such that it has a thickness that is substantially uniform over exposed surfaces of interconnect structure 300. In some embodiments, barrier layer 354 includes TiN, TaN, WN, CoN, MnN, self-assembled monolayers (SAMs) including silane, silanol, or silyl hydride, other suitable material, or combinations thereof. In the present embodiments, barrier layer 354 is selectively deposited on exposed surfaces of patterned conductive bulk layer 352 by CVD, ALD, electroless deposition, other suitable deposition process, or combinations thereof. In other words, barrier layer 354 is not deposited over the top surface of dielectric layer 330 and/or ESL 332 (though it may be in contact with dielectric layer 330 and/or ESL 332), nor is it deposited over the top surface of via bulk layer 340. Selective deposition of barrier layer 354 may be accomplished by various methods. For example, a precursor of the deposition material may be attached to a chemical ligand that preferentially adsorbs onto a conductive surface (e.g., the surface of patterned conductive bulk layer 352) rather than a dielectric surface (e.g., the surface of dielectric layer 330 and/or ESL 332). Furthermore, the conductive surface may include chemical functionalities configured to promote nucleation and growth of the deposited material (e.g., barrier layer 354). Additionally, when electroless deposition is implemented, the deposited material may be complexed with an agent that responds to a reducing agent, such that the redox reaction that drives the electroless deposition selectively occurs on a conductive surface (e.g., the surface of patterned conductive bulk layer 352) rather than a dielectric surface (e.g., the surface of dielectric layer 330 and/or ESL 332).

In many embodiments, conductive line 356 is formed to a thickness 362, which is measured from a bottom surface of conductive line 356 (for example, a bottom surface of patterned conductive bulk layer 352 disposed over the top surface of via 342) to a top surface of conductive line 356 (for example, a top surface of barrier layer 354), and via 342 is formed to a thickness 360, which is measured from the bottom surface of via 342 (for example, the bottom surface of via barrier layer 336 disposed over the top surface of conductive feature 322) to the top surface of via 342 (for example, the top surface of via bulk layer 340). In the depicted embodiment, a ratio of thickness 362 to thickness 360 is about 1:2 to about 1:10.

Figure 13A:
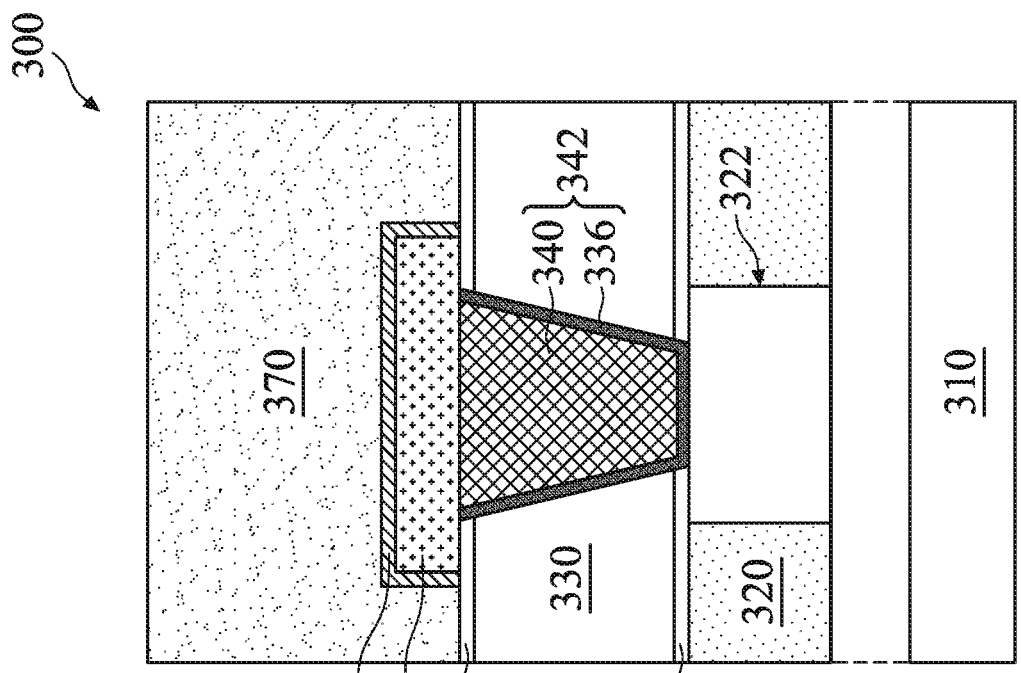

In FIG. 13A, referring to block 268, a dielectric layer 370 is formed over conductive line 356, dielectric layer 330, and/or ESL 332. Dielectric layer 370 is similar to ILD layers 42-48 depicted and described in FIG. 1 and FIGS. 2A-2C, and is formed by a deposition process, such as CVD, PECVD, spin-on dielectric, other suitable processes, or combinations thereof. In the depicted embodiment, dielectric layer 370 is formed over conductive line 356, dielectric layer 330, and/or ESL 332. In many implementations, dielectric layer 370 is configured to facilitate additional processing steps to fabricate interconnect structure 300. For example, fabrication of interconnect structure 300 may continue with forming a via over conductive line 356, where the via physically and/or electrically couples conductive line 356 to a conductive feature subsequently formed over the via. For example, the via is similar to via 92 depicted and described in FIG. 1 and FIGS. 2A-2C. The via may be formed in dielectric layer 370 disposed over conductive line 356 by implementing the lithography, etching, and/or deposition processes described herein with reference to method 250 as depicted in FIGS. 4-8.

Figure 13B:
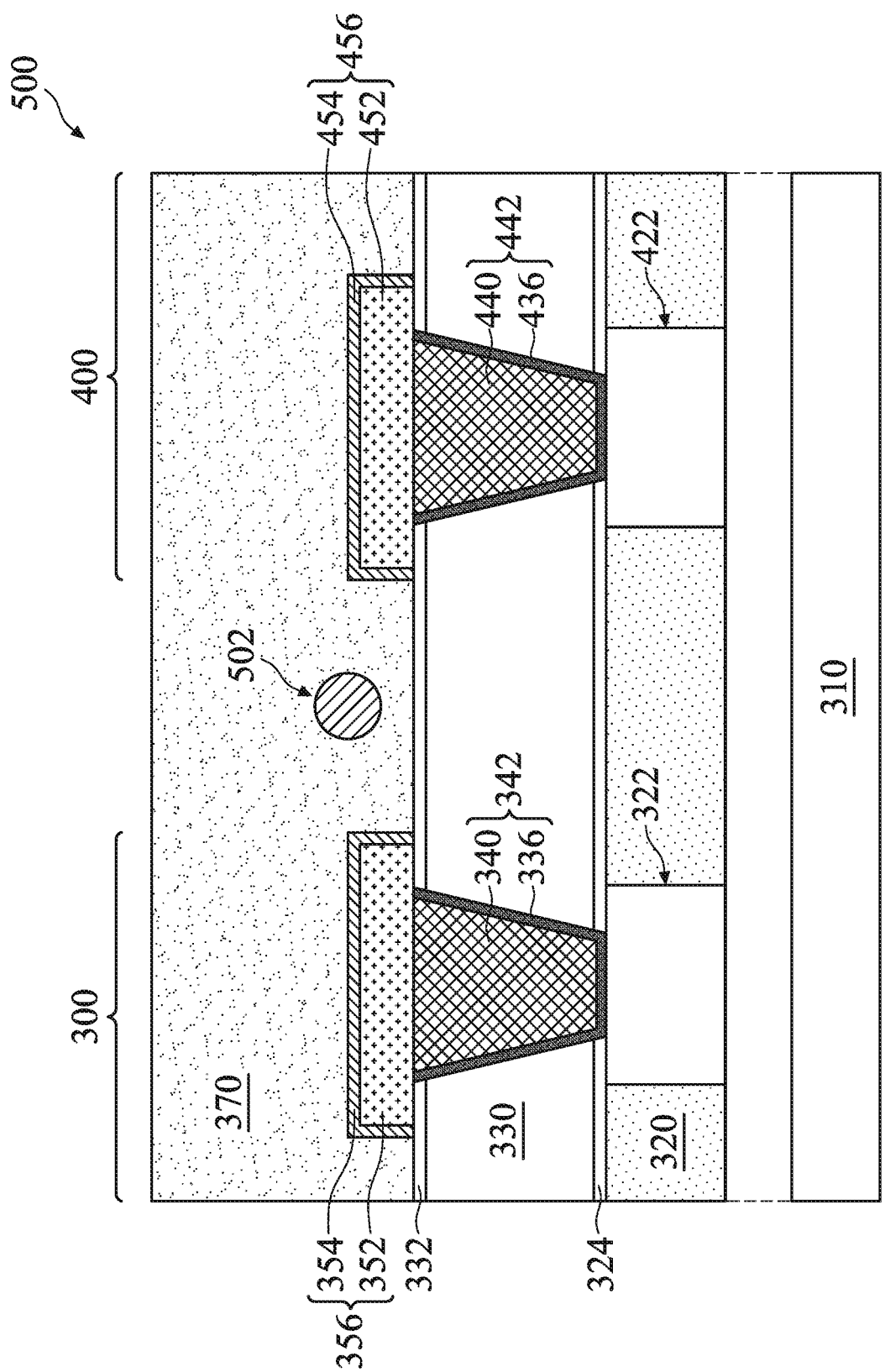

In FIG. 13B, an interconnect structure 500 including interconnect structure 300 and interconnect structure 400 formed adjacent to each other, such that they share substrate 310, dielectric layer 320, ESL 324, dielectric layer 330, ESL 332, and dielectric layer 370. In the depicted embodiment, a conductive feature 422, a via 442, and a conductive line 456 are formed similarly to conductive feature 322, via 342, and conductive line 356 of interconnect structure 300 as depicted and discussed above. For example, after forming conductive lines 356 and 456, dielectric layer 370 is deposited over conductive lines 356 and 456, dielectric layer 330, and/or ESL 332 by a deposition process such as CVD, PECVD, spin-on dielectric, other suitable processes, or combinations thereof. In the depicted embodiment, dielectric layer 370 is formed over conductive lines 356 and 456, dielectric layer 330, and/or ESL 332 by a suitable deposition process. In furtherance to the depicted embodiment, an air gap 502 is formed between interconnect structures 300 and 400 in dielectric layer 370. In some implementations, air gap 502 further reduces line-to-line capacitance within interconnect structure 500, thereby lowering the RC delay of the overall device. Generally, air gap 502 could only be formed if dielectric layer 370 is deposited over conductive lines 356 and 456 after they are formed by methods such as those disclosed herein. Methods during which dielectric layer 370 is formed first and then patterned would not result in such an air gap configured to reduce line-to-line capacitance of interconnect structure 500. In some embodiments, a size and location of air gap 502 is dependent upon a separation distance between adjacent conductive lines, such as conductive lines 356 and 456. In one example, if the separation distance between conductive lines 356 and 456 increases, the size of air gap 502 may decrease and its effect in reducing line-to-line capacitance may decrease as well.

Figures 14, 15:
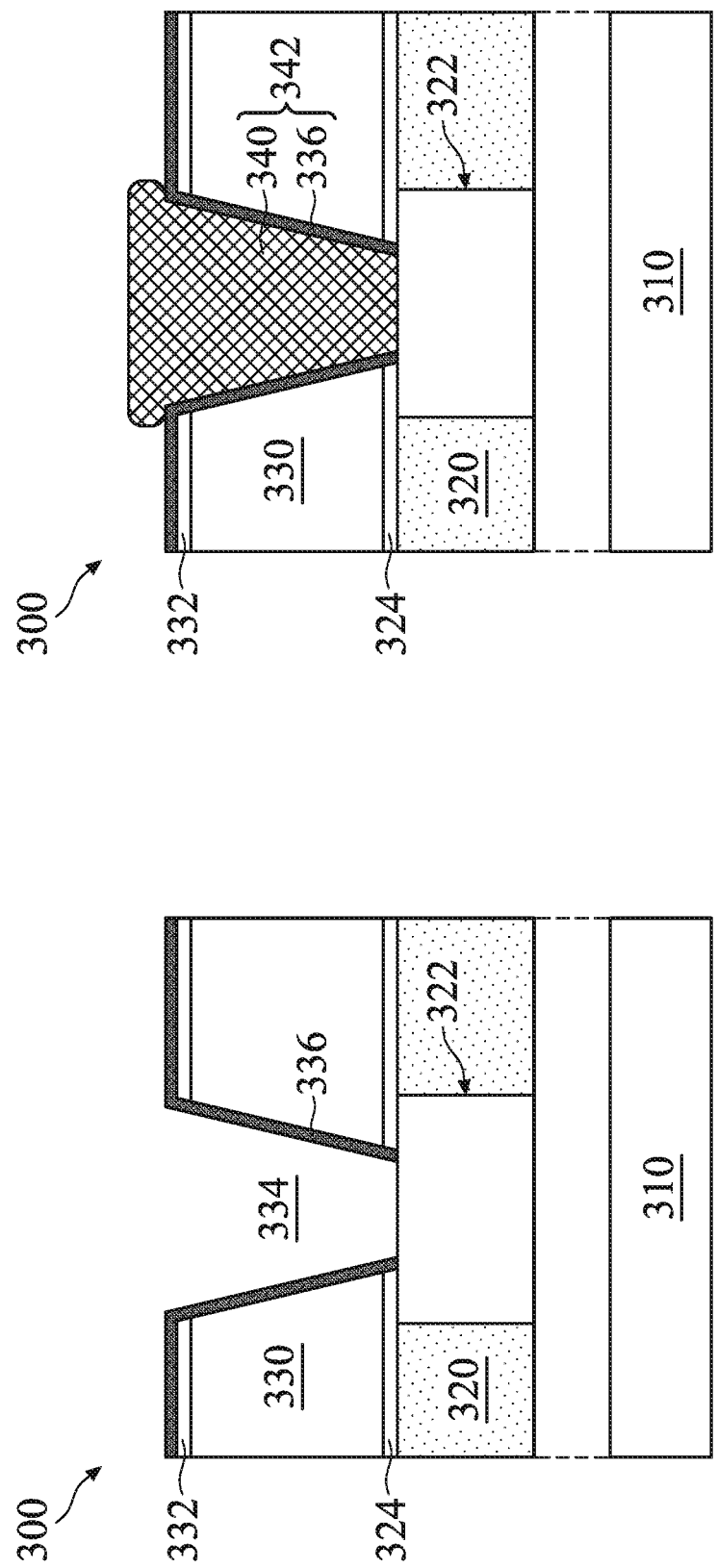

In FIG. 14, referring to block 256, which is alternative to block 254 of method 250, via barrier layer 336 is deposited in via opening 334. Various components depicted in FIG. 14 are similar to those labeled with the same reference numerals in FIG. 6. In the depicted embodiment, via barrier layer 336 is deposited along sidewall surfaces of via opening 334 defined by dielectric layer 330 and over the top surface of ESL 332 or of dielectric layer 330 if ESL 332 is omitted, but not over the top surface of conductive feature 322. In many embodiments, via barrier layer 336 includes TiN, TaN, WN, CoN, MnN, self-assembled monolayers including silane, silanol, or silyl hydride, other suitable material, or combinations thereof. The depicted embodiment provides that via barrier layer 336 is selectively formed over dielectric layer 330 and optionally over the top surface of ESL 332 by CVD, ALD, electroless deposition, other suitable deposition process, or combinations thereof, with mechanisms similar to those described above with reference to barrier layer 354. Additionally, via barrier layer 336 may be selectively formed in via opening 334 by providing a blocking layer on the bottom surface of via opening 334 before performing the deposition process, where a surface of the blocking layer inhibits or minimizes the deposition of the material of via barrier layer 336. As such, growth of via barrier layer 336 on the bottom surface of via opening 334 (i.e., on the top surface of conductive feature 322) may be limited. The blocking layer may include SAMs or an organic compound or polymer including, for example, phosphine, phosphate, carboxylic acid, amine, amide, sulfide, aromatic compounds having nitrogen, sulfur, and/or phosphorous, and/or derivatives thereof. After via barrier layer 336 is deposited, the blocking layer may be removed by any suitable method, such as wet etching or plasma etching.

In FIG. 15, referring to an alternative embodiment to that depicted in FIG. 7, via bulk layer 340 is formed in via opening 334. Via bulk layer 340 includes Ru, Co, Cu, nanotube, two-dimensional materials (e.g., graphene), other suitable materials, or combinations thereof as discussed above, and optionally a seed layer (such as a Cu-containing seed layer; not depicted). In the depicted embodiment, forming via bulk layer 340 involves growing suitable conductive material(s) in a bottom-up fashion; namely, an initial portion of via bulk layer 340 is selectively deposited on the exposed top surface of conductive feature 322 but not on via barrier layer 336, such that subsequently deposited via bulk layer 340 grows on itself rather than on via barrier layer 336. As such, in some embodiments, the top surface of via bulk layer 340 and a top surface of via barrier layer 336 disposed over the top surface of ESL 332 are substantially planar. In other words, a planarization process such as CMP may not be necessary. In some embodiments, as depicted herein, portions of via bulk layer 340 grow beyond the top surface of via barrier layer 336 (though still selectively grows on itself as discussed above), such that a CMP process is implemented to planarize the top surface of device 300 as discussed below. In furtherance of the depicted embodiment, via bulk layer 340 is selectively deposited by PVD, CVD, ALD, electroplating, electroless deposition, other suitable deposition process, or combinations thereof, with mechanisms similar to those described above with reference to barrier layer 354 when CVD, ALD, and/or electroless deposition are implemented. In some embodiments where a two-dimensional material (e.g., graphene) is deposited, selective deposition may be achieved by providing a catalytic surface (e.g., the top surface of conductive feature 322) with a suitable catalyst, such that the deposition of the 2D material may be enabled at a lower temperature on the catalytic surface and not the surface (e.g., a dielectric surface) surrounding it. In an example embodiment, when conductive feature 322 includes Co, the deposition temperature may be reduced to below about 400 degrees Celsius verses about 1000 degrees Celsius on a non-catalytic surface.

Figure 16:
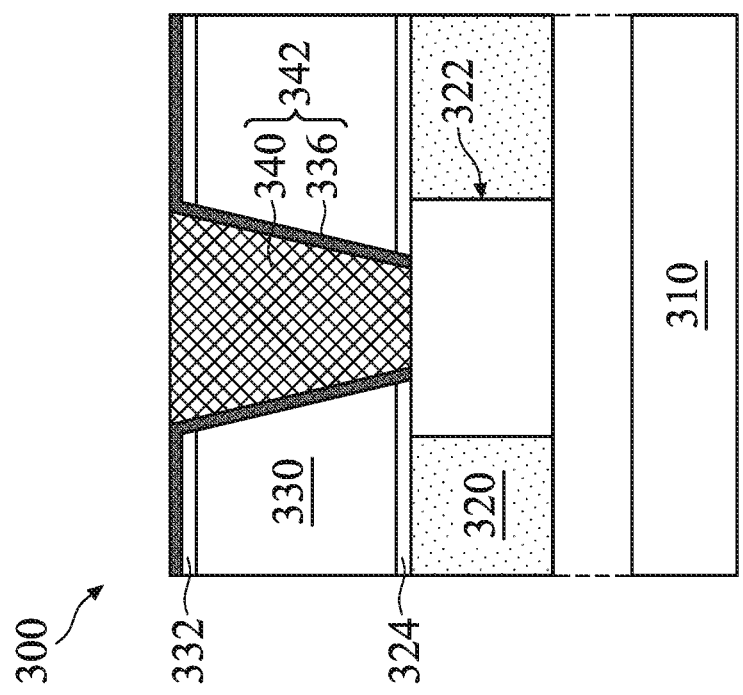

Thereafter, in FIG. 16, referring to an alternative embodiment to that depicted in FIG. 8, the CMP process removes portions of via bulk layer 340 formed over via barrier layer 336, such that portions of via barrier layer 336 remains over the top surface of ESL 332 and the top surface of via bulk layer 340 is substantially planar with the top surface of via barrier layer 336. Subsequently, conductive bulk layer 350 is formed over via barrier layer 336 similar to that depicted and described in FIG. 9, patterned conductive bulk layer 352 is formed over via bulk layer 340 and portions of via barrier layer 336 similar to that depicted and described in FIG. 2C, barrier layer 354 is deposited over patterned conductive bulk layer 352 to form conductive line 356 similar to that depicted and described in FIG. 12, and dielectric layer 370 is formed over conductive line 356, dielectric layer 330, and/or ESL 332 similar to that depicted and described in FIG. 13.

In one aspect, the present disclosure provides a method that includes forming a via in a dielectric layer, depositing a ruthenium-containing conductive layer over a top surface of the via and a top surface of the dielectric layer, and patterning the ruthenium-containing conductive layer to form a conductive line over the top surface of the via, where a thickness of the conductive line is less than a thickness of the via.

In another aspect, the present disclosure provides a method that begins with forming a first dielectric layer over a conductive feature and patterning the first dielectric layer to form a via opening, where the via opening exposes the conductive feature. The method proceeds to depositing a first barrier layer over sidewall surfaces of the via opening defined by the first dielectric layer and depositing a first bulk layer in the via opening over the first barrier layer, where the first barrier layer and the first bulk layer fill the via opening to form a via having a first thickness. The method subsequently proceeds to depositing a second bulk layer over a top surface of the via and a top surface of the first dielectric layer, where the second bulk layer includes ruthenium, and patterning the second bulk layer such that a remaining portion of the second bulk layer is disposed over the top surface of the via. Thereafter, the method proceeds to depositing a second barrier layer over the remaining portion of the second bulk layer, where the remaining portion of the second bulk layer and the second barrier layer form a conductive line having a second thickness over the via, and where the second thickness is less than the first thickness, and subsequently forming a second dielectric layer over the conductive line and the first dielectric layer.

In yet another aspect, the present disclosure provides an interconnect structure that includes a via having a first thickness disposed in a first dielectric layer, a ruthenium-containing conductive line having a second thickness disposed over the via, where the second thickness is less than the first thickness, and a second dielectric layer disposed over the ruthenium-containing conductive line and the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a via in a dielectric layer;
   depositing a ruthenium-containing conductive layer having a first ruthenium portion over a top surface of the via and a second ruthenium portion over a top surface of the dielectric layer; and
   forming a masking layer covering the first ruthenium portion and exposing a portion of the second ruthenium portion;
   removing the portion of the second ruthenium portion to form a conductive line over the top surface of the via, wherein a thickness of the conductive line is less than a thickness of the via;
   after the patterning of the ruthenium-containing conductive layer, forming a barrier layer over top and sidewall surfaces of the conductive line.

2. The method of claim 1, wherein the forming of the via includes:
   patterning the dielectric layer to form a via opening;
   conformally forming a via barrier layer over surfaces of the dielectric layer defining the via opening; and
   after the forming of the via barrier layer, depositing a via bulk layer in the via opening to form the via.

3. The method of claim 2, further comprising forming a contact etch-stop layer over the top surface of the dielectric layer before patterning the dielectric layer.

4. The method of claim 1, wherein patterning the ruthenium-containing conductive layer includes etching the ruthenium-containing conductive layer with a chlorine-containing gas, an oxygen-containing gas, or a combination thereof.

5. The method of claim 1, wherein the dielectric layer is a first dielectric layer, and the method further comprising forming a second dielectric layer over a top surface and a sidewall surface of the barrier layer.

6. The method of claim 5, wherein the second dielectric layer includes an air gap between adjacent portions of the patterned ruthenium-containing conductive layer.

7. A method, comprising:
   forming a first dielectric layer over a conductive feature;
   patterning the first dielectric layer to form a via opening, wherein the via opening exposes the conductive feature;
   depositing a first barrier layer over sidewall surfaces of the via opening defined by the first dielectric layer;
   depositing a first bulk layer in the via opening over the first barrier layer, wherein the first barrier layer and the first bulk layer fill the via opening to form a via having a first thickness;
   depositing a second bulk layer over and directly contacting a top surface of the via and a top surface of the first dielectric layer, wherein the second bulk layer includes ruthenium;
   patterning the second bulk layer, such that a remaining portion of the second bulk layer is disposed over the top surface of the via;
   depositing a second barrier layer over a top and a sidewall surface of the remaining portion of the second bulk layer, wherein the remaining portion of the second bulk layer and the second barrier layer form a conductive line having a second thickness over the via, and wherein the second thickness is less than the first thickness; and
   forming a second dielectric layer over the conductive line and the first dielectric layer.

8. The method of claim 7, wherein depositing of the first bulk layer includes depositing a cobalt-containing material in the via opening.

9. The method of claim 7, wherein depositing the first barrier layer includes forming the first barrier layer over the top surface of the first dielectric layer.

10. The method of claim 9, further comprising performing a chemical-mechanical polishing (CMP) process to the first bulk layer, wherein performing the CMP process removes the first barrier layer formed over the top surface of the first dielectric layer.

11. The method of claim 9, wherein depositing the second bulk layer further includes forming the second bulk layer over the first barrier layer disposed over the top surface of the first dielectric layer.

12. The method of claim 9, wherein depositing of the first barrier layer includes forming the first barrier layer on the sidewall surfaces of the via opening defined by the first dielectric layer but not over a bottom surface of the via opening defined by the conductive feature, and wherein depositing the first bulk layer in the via opening includes performing a bottom-up selective deposition.

13. The method of claim 7, wherein the remaining portion of the second bulk layer is a first remaining portion of the second bulk layer, wherein the patterning of the second bulk layer forms a second remaining portion of the second bulk layer, and wherein the forming of the second dielectric layer includes forming an air gap between the first remaining portion of the second bulk layer and the second remaining portion of the second bulk layer.

14. A method, comprising:
   forming a first interlayer dielectric (ILD) layer over a first conductive feature;
   forming a via in the first ILD layer, wherein the via is electrically coupled to the first conductive feature, and wherein the via has a first thickness;
   depositing a conductive layer on a top surface of the first ILD layer, wherein the conductive layer is electrically coupled to the via;
   trimming the conductive layer to expose a portion of the first ILD layer and to form a second conductive feature and a third conductive feature on opposite sides of the portion of the first ILD layer;
   after the trimming of the conductive layer, depositing a barrier layer on sidewall surfaces of the second conductive feature and the third conductive feature to form conductive lines each having a second thickness, wherein the second thickness is less than the first thickness; and forming a second ILD layer over the first ILD layer, such that the conductive lines are embedded in the second ILD layer and that the second ILD layer includes an air gap between the conductive lines.

15. The method of claim 14, wherein the barrier layer is a first barrier layer, and wherein forming the via includes:

patterning the first ILD layer to form an opening, wherein the opening exposes the first conductive feature;

selectively depositing a second barrier layer to contact sidewall surfaces of the opening defined by the first ILD layer; and depositing a metal layer in the opening over the second barrier layer, wherein the second barrier layer and the metal layer fill the opening to form the via.

16. The method of claim 15, wherein depositing the metal layer results in the metal layer to selectively grow on the conductive feature but not on the second barrier layer.

17. The method of claim 15, wherein the metal layer includes ruthenium, cobalt, or a combination thereof.

18. The method of claim 14, wherein depositing the barrier layer includes selectively forming the barrier layer on the second conductive feature and the third conductive feature but not over the first ILD layer.

19. The method of claim 14, wherein trimming the conductive layer includes:

forming a patterned masking layer over the conductive layer to expose a portion thereof; and etching the exposed portion of the conductive layer with a chlorine-containing gas, an oxygen-containing gas, or a combination thereof.

20. The method of claim 14, wherein the depositing of the conductive layer includes depositing the conductive layer to directly interface with the via.

* * * * *